US012642139B2

(12) United States Patent
Jee et al.

(10) Patent No.: US 12,642,139 B2
(45) Date of Patent: May 26, 2026

(54) SEMICONDUCTOR PACKAGE AND METHOD OF FABRICATING THE SAME

(71) Applicant: Samsung Electronics Co., Ltd., Suwon-si (KR)

(72) Inventors: Young Kun Jee, Suwon-si (KR); Sanghoon Lee, Suwon-si (KR); Un-Byoung Kang, Suwon-si (KR); Sang Cheon Park, Suwon-si (KR); Jumyong Park, Suwon-si (KR); Hyunchul Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/135,035

(22) Filed: Apr. 14, 2023

(65) Prior Publication Data

US 2024/0105679 A1     Mar. 28, 2024

(30) Foreign Application Priority Data

Sep. 28, 2022     (KR) ........................ 10-2022-0123245

(51) Int. Cl.
H01L 25/065 (2023.01)
H01L 21/768 (2006.01)
(Continued)

(52) U.S. Cl.
CPC ......... H10W 90/00 (2026.01); H10W 20/023 (2026.01); H10W 20/20 (2026.01);
(Continued)

(58) Field of Classification Search
CPC .............. H01L 25/0657; H01L 23/481; H01L 23/3128; H01L 21/76898
See application file for complete search history.

(56) References Cited

U.S. PATENT DOCUMENTS 6,143,663 A * 11/2000 Koutny, Jr. ......... H01L 21/3212
                                                        438/692
8,158,456 B2     4/2012 Chen et al.
(Continued)

FOREIGN PATENT DOCUMENTS

KR     20140042090 A     4/2014
KR     10-1403110 B1     6/2014
(Continued)

*Primary Examiner* — Dale E Page
*Assistant Examiner* — Wilner Jean Baptiste
(74) *Attorney, Agent, or Firm* — Muir Patent Law, PLLC

(57) ABSTRACT

Disclosed are semiconductor packages and their fabrication methods. The semiconductor package comprises providing a semiconductor substrate, forming a semiconductor element on an active surface of the semiconductor substrate, forming in the semiconductor substrate through vias that extend from the active surface into the semiconductor substrate, forming a first pad layer on the active surface of the semiconductor substrate, performing a first planarization process on the first pad layer, performing on an inactive surface of the semiconductor substrate a thinning process to expose the through vias, forming a second pad layer on the inactive surface of the semiconductor substrate, performing a second planarization process on the second pad layer, and after the second planarization process, performing a third planarization process on the first pad layer.

20 Claims, 32 Drawing Sheets

(51) Int. Cl.

| | |
|---|---|
| *H10W 20/00* | (2026.01) |
| *H10W 20/20* | (2026.01) |
| *H10W 74/10* | (2026.01) |
| *H10W 90/00* | (2026.01) |
| *H10W 72/00* | (2026.01) |
| *H10W 90/20* | (2026.01) |

(52) U.S. Cl.

CPC ........ *H10W 74/117* (2026.01); *H10W 72/019* (2026.01); *H10W 90/297* (2026.01); *H10W 90/792* (2026.01)

(56) References Cited

U.S. PATENT DOCUMENTS

| | | | |
|---|---|---|---|
| 8,809,123 B2 | 8/2014 | Liu et al. | |
| 9,960,142 B2 | 5/2018 | Chen et al. | |
| 11,114,408 B2 | 9/2021 | Shen et al. | |
| 11,139,272 B2 | 10/2021 | Makala et al. | |
| 11,342,244 B2 | 5/2022 | Kim et al. | |
| 11,728,254 B2 * | 8/2023 | Hou | H01L 23/49861 |
| | | | 257/737 |
| 2012/0193785 A1 * | 8/2012 | Lin | H01L 21/76898 |
| | | | 257/737 |
| 2015/0123284 A1 * | 5/2015 | Jo | H01L 23/481 |
| | | | 257/774 |
| 2018/0204791 A1 * | 7/2018 | Chen | H01L 23/49827 |
| 2022/0157704 A1 | 5/2022 | Hiblot et al. | |

FOREIGN PATENT DOCUMENTS

| | | |
|---|---|---|
| KR | 20220067212 A | 5/2022 |
| KR | 20220075030 A | 6/2022 |

* cited by examiner 262
270
210
250
1060

222 230 240

UP(224)　　UP(224)　　UP(224)

262
270
226
210a
210
230
210b
1060

224

TR(222)

230

250

240　　　240　　　240

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0123245, filed on Sep. 28, 2022, in the Korean Intellectual Property Office, the disclosure of which is hereby incorporated by reference in its entirety.

BACKGROUND

Aspects of the present inventive concept relate to a directly bonded semiconductor package and a method of fabricating the same.

In the semiconductor industry, high capacity, thinness, and small size of semiconductor packages and electronic products using the same have been demanded and thus various package techniques have been suggested. One approach of the various package techniques is a packaging technique which vertically stacks a plurality of semiconductor chips to achieve a high-density chip stacking. This packaging technique has an advantage capable of integrating semiconductor chips having various functions on a small area than a conventional package consisting of one semiconductor chip.

A semiconductor package is provided to implement an integrated circuit chip to be suitable for use in electronic products. A semiconductor package is typically configured such that a semiconductor chip is mounted on a printed circuit board and bonding wires or bumps are used to electrically connect the semiconductor chip to the printed circuit board. With the development of electronic industry, various research have been conducted to improve reliability and durability of semiconductor packages.

SUMMARY

Some embodiments of the present inventive concept provide a semiconductor package with increased structural stability and a method of fabricating the same.

Some embodiments of the present inventive concept provide a semiconductor package with good electrical connection between semiconductor chips and a method of fabricating the same.

Some embodiments of the present inventive concept provide a semiconductor package fabrication method with rare occurrence of defects and a semiconductor package fabricated by the same.

According to some embodiments of the present inventive concept, a method of fabricating a semiconductor package may comprise: providing a semiconductor substrate extending in a first direction and a second direction, perpendicular to the first direction; forming a semiconductor element on an active surface of the semiconductor substrate; forming through vias in the semiconductor substrate, the through vias extending from the active surface into the semiconductor substrate; forming a first pad layer on the active surface of the semiconductor substrate; performing a first planarization process on the first pad layer; performing on an inactive surface of the semiconductor substrate a thinning process to expose the through vias; forming a second pad layer on the inactive surface of the semiconductor substrate; performing a second planarization process on the second pad layer; and after the second planarization process, performing a third planarization process on the first pad layer.

According to some embodiments of the present inventive concept, a method of fabricating a semiconductor package may comprise: providing a semiconductor substrate extending in a first direction and a second direction, perpendicular to the first direction; forming a semiconductor element on an active surface of the semiconductor substrate; forming first pads on the active surface of the semiconductor substrate and a first passivation layer that surrounds the first pads and exposes one surface of each of the first pads; performing a first planarization process on the first pads and the first passivation layer; performing a thinning process on an inactive surface of the semiconductor substrate; performing a second planarization process on the inactive surface of the semiconductor substrate; and performing a third planarization process on the first pads and the first passivation layer. After the third planarization process, a thickness, in a third direction perpendicular to the first direction and the second direction, of the first passivation layer may be changed based on position along the first direction.

According to some embodiments of the present inventive concept, a semiconductor package may comprise: a substrate extending in a first direction and a second direction, perpendicular to the first direction; semiconductor chips stacked on the substrate; and a molding layer on the substrate, the molding layer surrounding the semiconductor chips. Each of the semiconductor chips may include: a semiconductor substrate having a first surface and a second surface that are opposite to each other; a semiconductor element on the first surface of the semiconductor substrate; first pads on the semiconductor element and a first passivation layer that surrounds the first pads and exposes one surface of each of the first pads; second pads on the second surface of the semiconductor substrate and a second passivation layer that surrounds the second pads and exposes one surface of each of the second pads; and through vias that penetrate, in a third direction perpendicular to the first direction and the second direction, the semiconductor substrate and connect the first pads to the second pads. Two neighboring ones of the semiconductor chips may be in contact with each other. The first pads may be in contact with the second pads. A thickness, in the third direction, of the first passivation layer may be changed based on position along the first direction.

According to some embodiments of the present inventive concept, a semiconductor package may comprise: a substrate extending in a first direction and a second direction, perpendicular to the first direction; semiconductor chips stacked on the substrate; and a molding layer on the substrate, the molding layer surrounding the semiconductor chips. Each of the semiconductor chips may include: a semiconductor substrate; a semiconductor element on an active surface of the semiconductor substrate; first pads on the semiconductor element and a first passivation layer that surrounds the first pads and exposes one surface of each of the first pads; second pads on an inactive surface of the semiconductor substrate; and through vias that penetrate, in a third direction perpendicular to the first direction and the second direction, the semiconductor substrate and connect the first pads to the second pads. Two neighboring ones of the semiconductor chips may be in contact with each other, and the first pads are in contact with the second pads. A first surface of the first passivation layer may be uneven and a second surface of the first passivation layer may be flat. The first surface may face the semiconductor substrate. The second surface may be opposite to the first surface.

BRIEF DESCRIPTION OF THE DRAWINGS

FIGS. 7A to 30A illustrate cross-sectional views showing a method of fabricating a semiconductor package according to some example embodiments of the present inventive concept.

FIGS. 7B to 30B illustrate cross-sectional views showing a method of fabricating a semiconductor package according to some example embodiments of the present inventive concept.

DETAIL PARTED DESCRIPTION OF EMBODIMENTS

The following will now describe a semiconductor package according to aspects of the present inventive concept with reference to the accompanying drawings.

Figure 1:
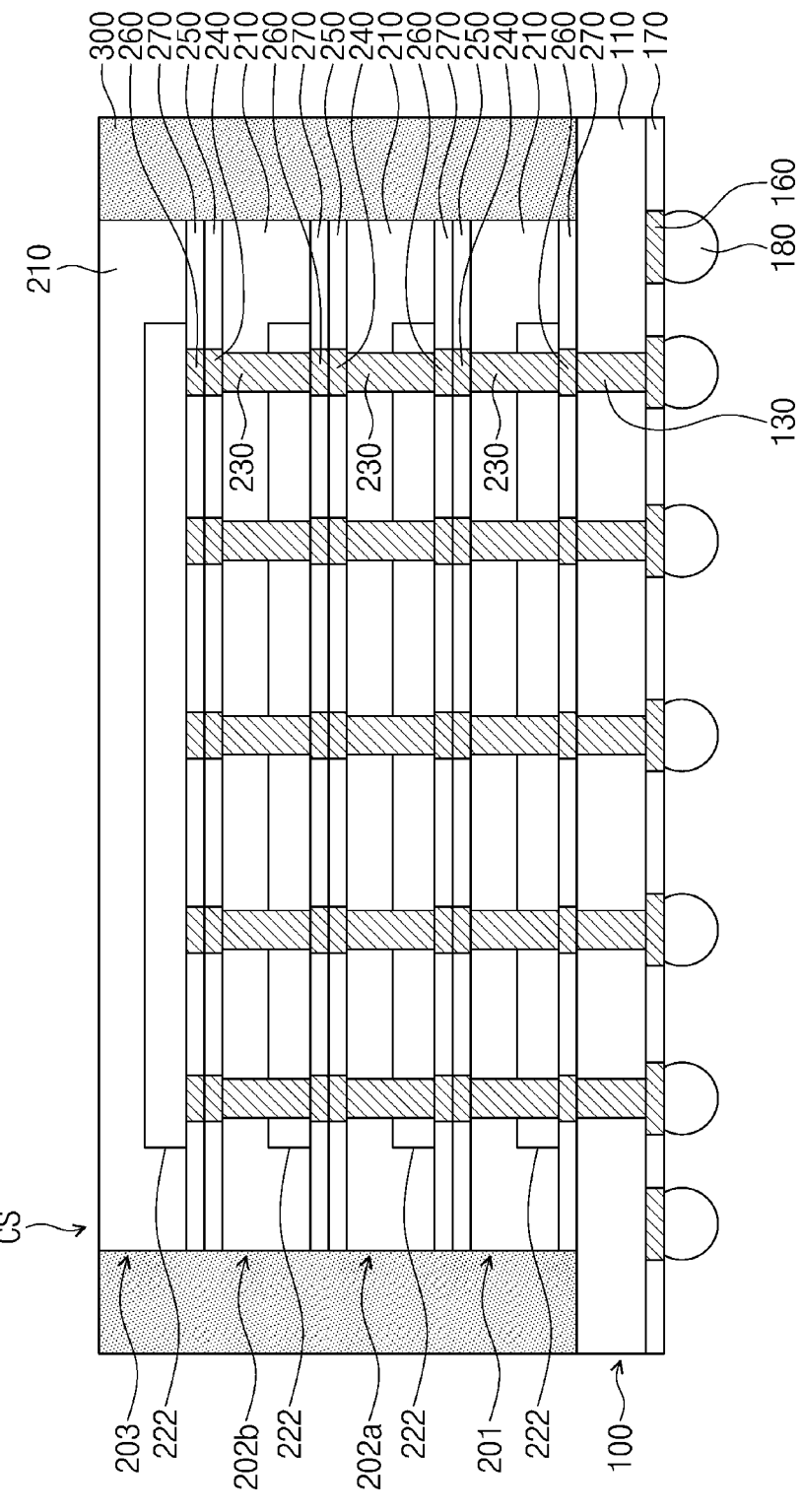
FIG. 1 illustrates a cross-sectional view showing a semiconductor package according to some example embodiments of the present inventive concept.
Figure 2:
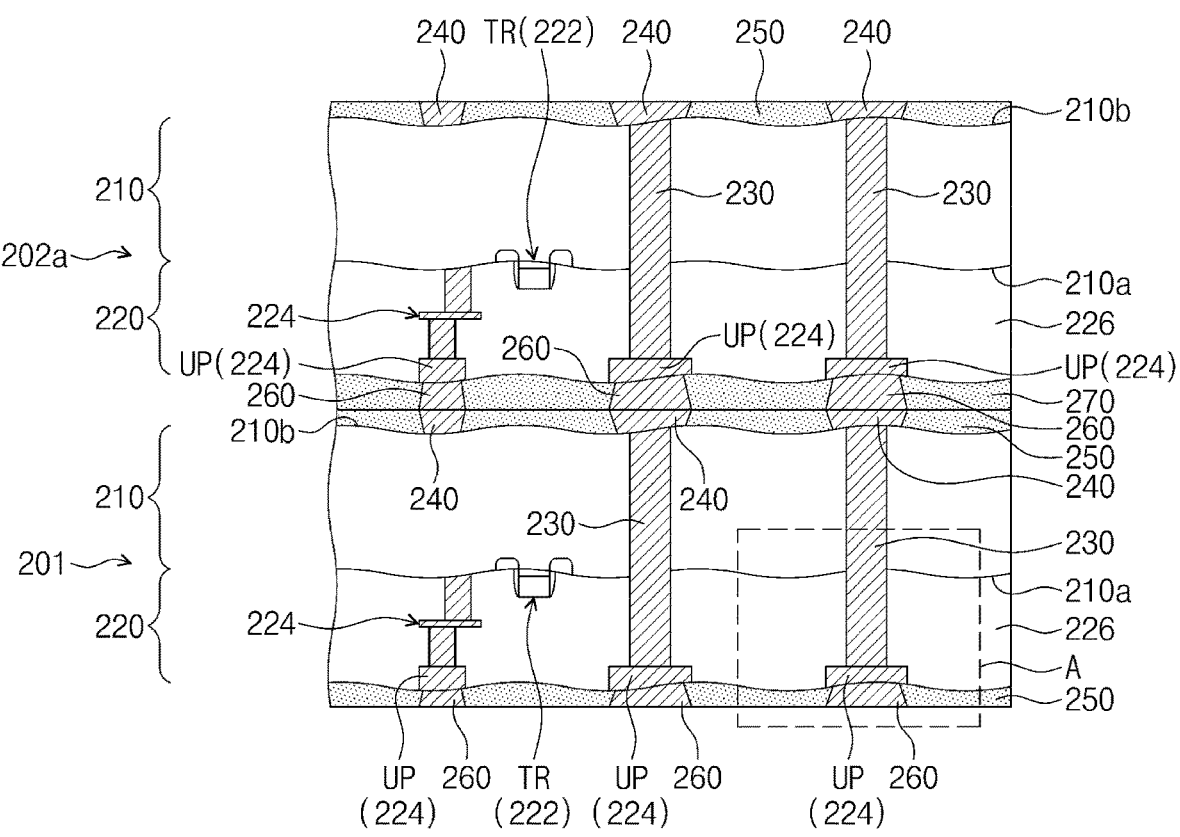
FIG. 2 illustrates a cross-sectional view showing a bonding between semiconductor chips.
Figure 3:
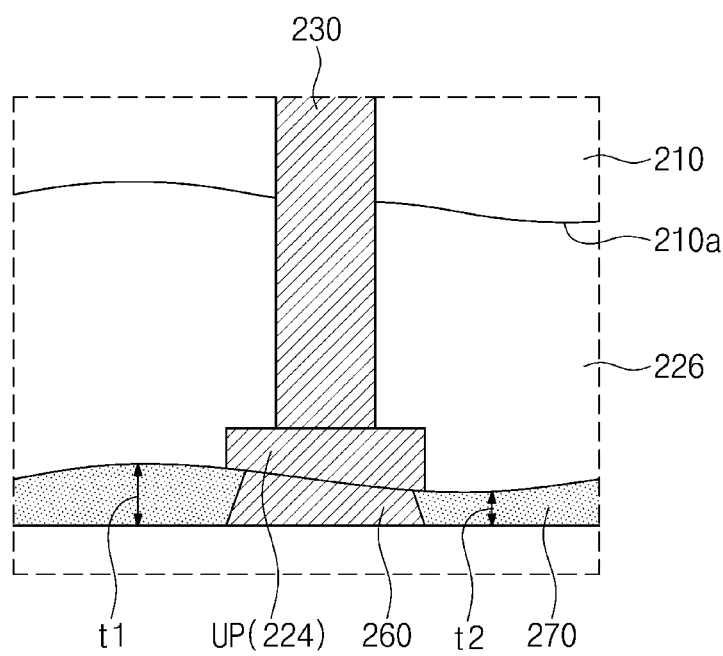
FIG. 3 illustrates an enlarged view showing section A of FIG. 2.

FIG. 1 illustrates a cross-sectional view showing a semiconductor package according to some example embodiments of the present inventive concept. For convenience of description, some components will be omitted or many of components will be merged into a single configuration in FIG. 1. FIG. 2 illustrates a cross-sectional view showing a bonding between semiconductor chips. FIG. 3 illustrates an enlarged view showing section A of FIG. 2.

A semiconductor package according to some embodiments of the present inventive concept may be a stacked package in which vias are used. For example, semiconductor chips of the same type may be stacked on a base substrate, and the semiconductor chips may be electrically connected to each other through vias that penetrate therethrough. The semiconductor chips may be bonded to each other through their pads that face each other.

Referring to FIG. 1, a base substrate 100 may be provided. The base substrate 100 may include an integrated circuit therein. The base substrate 100 may be a first semiconductor chip that includes an electronic element such a transistor. For example, the base substrate 100 may be a wafer-level die formed of a semiconductor such as silicon (Si). FIG. 1 shows that the base substrate 100 is a first semiconductor chip, but aspects of the present inventive concept are not limited thereto. According to some embodiments of the present inventive concept, the base substrate 100 may be a substrate, such as a printed circuit board (PCB), which does not include an electronic element such as a transistor. A silicon wafer may have a thickness less than that of a printed circuit board (PCB). The following will describe an example in which the base substrate 100 and a first semiconductor chip are the same component.

The first semiconductor chip 100 may include a first semiconductor substrate 110, first vias 130, first lower pads 160, and a first lower passivation layer 170.

The first semiconductor substrate 110 may include a semiconductor material. For example, the first semiconductor substrate 110 may be a monocrystalline silicon (Si) substrate. The first semiconductor substrate 110 may be extend in a first direction and a second direction, perpendicular to the first direction. The first and second direction may be referred to herein as horizontal directions.

Although not shown, a first circuit layer may be provided on a bottom surface of the first semiconductor substrate 110. The first circuit layer may include the integrated circuit. For example, the first circuit layer may be a memory circuit, a logic circuit, or a combination thereof. The bottom surface, on which the first circuit layer is provided, of the first semiconductor chip 100 may be an active surface. According to some embodiments, the first circuit layer may not be provided.

The first vias 130 may vertically (i.e., in a third direction perpendicular to the first direction and the second direction) penetrate the first semiconductor substrate 110. For example, the first vias 130 may be exposed on a top surface of the first semiconductor substrate 110. The first vias 130 may have top surfaces coplanar with that of the first semiconductor substrate 110. A dielectric layer (not shown) may be provided as needed to surround the first via 130. For example, the dielectric layer (not shown) may include at least one selected from silicon oxide (SiO), silicon nitride (SiN), silicon oxynitride (SiON), and low-k dielectric.

The first lower pads 160 may be disposed on the bottom surface of the first semiconductor substrate 110. When the first circuit layer is provided, the first lower pads 160 may be electrically connected to the first circuit layer. The first lower pads 160 may include various metallic materials, such as one or more of copper (Cu), aluminum (Al), and nickel (Ni).

The first lower passivation layer 170 may be disposed on the bottom surface of the first semiconductor substrate 110 to cover the first semiconductor substrate 110. A bottom surface of the first lower passivation layer 170 may expose (i.e., not cover) the first lower pads 160. For example, the bottom surface of the first lower passivation layer 170 may be substantially coplanar with a bottom surface of the first lower pads 160. When the first circuit layer is provided, the first circuit layer may be protected by the first lower passivation layer 170. The first lower passivation layer 170 may be a dielectric coating layer including epoxy resin. Terms such as "same," "equal," "flat," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," "substantially flat," or "substantially planar," may be exactly the same, equal, flat, or planar, or may be the same, equal, flat, or planar within acceptable variations that may occur, for example, due to manufacturing processes.

The first semiconductor chip 100 may be provided with external terminals 180 on a bottom surface thereof. The external terminals 180 may be disposed on the first lower pads 160. The external terminals 180 may be correspondingly coupled to the first lower pads 160. The external terminals 180 may be electrically connected to the first semiconductor substrate 110 and the first vias 130. The external terminal 180 may be an alloy that includes at least one selected from tin (Sn), silver (Ag), copper (Cu), nickel (Ni), bismuth (Bi), indium (In), antimony (Sb), and cerium (Ce). According to some embodiments, the external terminal 180 may be directly connected to bottom surfaces of the first vias 130, and in this case, neither the first lower pads 160 nor the first lower passivation layer 170 may be provided.

Although not shown, the first semiconductor chip 100 may further include first upper pads and a first upper passivation layer.

The first upper pads may be disposed on the top surface of the first semiconductor substrate 110. The first upper pads may be correspondingly coupled to the first vias 130. The first upper pads may be coupled, through the first vias 130, to the first circuit layer. The first upper pads may include various metallic materials, such as one or more of copper (Cu), aluminum (Al), and nickel (Ni).

The first upper passivation layer may be disposed on the top surface of the first semiconductor substrate 110 to surround the first upper pads. The first upper passivation layer may expose the first upper pads. The first upper passivation layer may be coplanar with those of the first upper pads. The first semiconductor substrate 110 may be protected by the first upper passivation layer. The first upper passivation layer may include one of high-density plasma (HDP) oxide, undoped silicate glass (USG), tetraethyl orthosilicate (TEOS), silicon nitride (SiN), silicon oxide (SiO), silicon carboxide (SiOC), silicon oxynitride (SiON), and silicon carbonitride (SiCN).

A chip stack CS may be disposed on the first semiconductor chip 100. The chip stack CS may include a plurality of second semiconductor chips 201, 202a, 202b, and 203. The second semiconductor chips 201, 202a, 202b, and 203 may be of the same type. For example, the second semiconductor chips 201, 202a, 202b, and 203 may be memory chips. The chip stack CS may include a lower semiconductor chip 201 directly connected to the first semiconductor chip 100, intermediate semiconductor chips 202a and 202b disposed on the lower semiconductor chip 201, and an upper semiconductor chip 203 disposed on the intermediate semiconductor chips 202a and 202b. The lower semiconductor chip 201, the intermediate semiconductor chips 202a and 202b, and the upper semiconductor chip 203 may be sequentially stacked on the first semiconductor chip 100. The intermediate semiconductor chips 202a and 202b may be stacked on each other between the lower semiconductor chip 201 and the upper semiconductor chip 203. In the present embodiment, it is explained that two intermediate semiconductor chips 202a and 202b are interposed between the lower semiconductor chip 201 and the upper semiconductor chip 203, but aspects of the present inventive concept are not limited thereto. According to some embodiments, one or more than three intermediate semiconductor chips may be interposed between the lower semiconductor chip 201 and the upper semiconductor chip 203, or no intermediate semiconductor chip may be provided between the lower semiconductor chip 201 and the upper semiconductor chip 203.

Referring to FIGS. 1 to 3, the lower semiconductor chip 201 may include a second semiconductor substrate 210, a second circuit layer 220, a second via 230, a second upper pad 240, a second upper passivation layer 250, a second lower pad 260, and a second lower passivation layer 270.

The second semiconductor substrate 210 may include a semiconductor material. For example, the second semiconductor substrate 210 may be a monocrystalline silicon (Si)

substrate. The second semiconductor substrate 210 may have a first surface 210a and a second surface 210b that are opposite to each other. The first surface 210a may be a front surface of the second semiconductor substrate 210, and the second surface 210b may be a rear surface of the second semiconductor substrate 210. In this description, the front surface 210a of the second semiconductor substrate 210 may be defined to indicate a surface on which semiconductor elements are formed or mounted or wiring lines and pads are formed, and the rear surface 210b of the second semiconductor substrate 210 may be defined to indicate a surface opposite to the front surface 210a. The first surface 210a of the second semiconductor substrate 210 may be directed toward the first semiconductor chip 100. For example, a bottom surface of the second semiconductor substrate 210 may be an active surface. As shown in FIGS. 2 and 3, the second semiconductor substrate 210 may be uneven. For example, the front surface 210a of the second semiconductor substrate 210 may have a wavy (e.g., not flat or not planar) shape, and likewise the rear surface 210b of the second semiconductor substrate 210 may be wavy shape. In more detail, each of the front surface 210a and the rear surface 210b may have a wavy shape in which is repeated a series of concave shapes directed inwardly toward the second semiconductor substrate 210 and convex shapes directed outwardly away from the second semiconductor substrate 210. In this configuration, on each of the front surface 210a and the rear surface 210b, a height difference between top and bottom, or valley and ridge, of the wavy shape may range from about 50 Å to about 500 Å.

The lower semiconductor chip 201 may have the second circuit layer 220 that faces the first semiconductor chip 100. The second circuit layer 220 may include a semiconductor element 222 and a device wiring part 224.

The semiconductor element 222 may include transistors TR provided on the first surface 210a of the second semiconductor substrate 210. For example, the transistors TR may each include a source and a drain that are formed on a lower portion of the second semiconductor substrate 210, a gate electrode disposed on the first surface 210a of the second semiconductor substrate 210, and a gate dielectric layer interposed between the second semiconductor substrate 210 and the gate electrode. FIG. 2 depicts that one transistor TR is provided, but aspects of the present inventive concept are not limited thereto. The semiconductor element 222 may include a plurality of transistors TR. The semiconductor element 222 may include a memory circuit. Although not shown, the semiconductor element 222 may include a shallow device isolation pattern, a logic cell, or a plurality of memory cells on the first surface 210a. Alternatively, the semiconductor element 222 may include a passive element such as a capacitor.

The first surface 210a of the second semiconductor substrate 210 may be covered with a device interlayer dielectric layer 226. The device interlayer dielectric layer 226 may bury the semiconductor element 222. The device interlayer dielectric layer 226 may downwardly cover the semiconductor element 222. For example, the semiconductor element 222 may not be exposed by the device interlayer dielectric layer 226. A lateral surface of the device interlayer dielectric layer 226 may be aligned with that of the second semiconductor substrate 210. A shape of the first surface 210a of the second semiconductor substrate 210 may be transferred onto the device interlayer dielectric layer 226. For example, the device interlayer dielectric layer 226 may have a wavy shape on a bottom surface thereof. In more detail, the bottom surface of the device interlayer dielectric layer 226 may have a wavy shape in which is repeated a series of concave shapes directed inwardly toward the second semiconductor substrate 210 and convex shapes directed outwardly away from the second semiconductor substrate 210. On the bottom surface of the device interlayer dielectric layer 226, a height difference between top and bottom, or valley and ridge, of the wavy shape may range from about 50 Å to about 500 Å. The device interlayer dielectric layer 226 may include, for example, at least one selected from silicon oxide (SiO), silicon nitride (SiN), and silicon oxynitride (SiON). Although not shown, the device interlayer dielectric layer 226 may include a low-k dielectric material. The device interlayer dielectric layer 226 may have a mono-layered structure or a multi-layered structure. When the device interlayer dielectric layer 226 is provided in the form of the multi-layered structure, subsequently described wiring layers may be provided in each dielectric layer, and an etch stop layer may be interposed between the dielectric layers. For example, the etch stop layer may be provided on a bottom surface of each dielectric layer. The etch stop layer may include, for example, one of silicon nitride (SiN), silicon oxynitride (SiON), and silicon carbonitride (SiCN).

The device interlayer dielectric layer 226 may be provided therein with the device wiring part 224 connected to the transistors TR. The device wiring part 224 may include wiring patterns for horizontal connection and connection contacts for vertical connection. Portions (each being referred to hereinafter as an under-pad pattern UP) of the wiring patterns may be exposed on the bottom surface of the device interlayer dielectric layer 226. For example, the under-pad pattern UP may be a wiring pattern positioned at a lowermost portion of the device wiring part 224 provided in the device interlayer dielectric layer 226. A bottom surface of the under-pad pattern UP may be coplanar with that of the device interlayer dielectric layer 226. The wiring patterns may each have another portion located between top and bottom surfaces of the device interlayer dielectric layer 226. FIG. 2 depicts that another portion of the wiring pattern is provided in the form of one wiring layer between the second semiconductor substrate 210 and the under-pad pattern UP, but aspects of the present inventive concept are not limited thereto. According to some embodiments, another portion of the wiring pattern may be provided in the form of a plurality of wiring layers. The following description will focus on the embodiment of FIG. 2. The wiring patterns may include, for example, copper (Cu) or tungsten (W).

The connection contacts may connect the wiring patterns to each other, or may connect the wiring patterns to the semiconductor element 222 or the second semiconductor substrate 210. For example, portions of the connection contacts may vertically penetrates the device interlayer dielectric layer 226 to be connected to ones of source electrodes, drain electrodes, and gate electrodes of the transistors TR or to various components of the semiconductor element 222. The connection contacts may include, for example, tungsten (W).

The second circuit layer 220 may be constituted by the semiconductor element 222, the transistors TR of the semiconductor element 222, the device interlayer dielectric layer 226, and the device wiring part 224.

The lower semiconductor chip 201 may have the second vias 230 that vertically penetrate the second semiconductor substrate 210 and are connected to the under-pad pattern UP. The second vias 230 may be patterns for vertical connection. The second vias 230 may vertically penetrate the device interlayer dielectric layer 226 to be coupled to a top surface of the under-pad pattern UP. The second vias 230 may vertically penetrate the device interlayer dielectric layer 226 and the second semiconductor substrate 210 to be exposed on a top surface of the second semiconductor substrate 210. The second vias 230 may include, for example, tungsten (W).

The second lower pads 260 may be disposed on the device interlayer dielectric layer 226. The second lower pads 260 may be disposed on the bottom surface of the under-pad pattern UP. The second lower pads 260 may be electrically connected to the semiconductor element 222. For example, as shown in FIG. 2, the second lower pad 260 may be coupled to the bottom surface of the under-pad pattern UP included in the device wiring part 224. In this sense, the under-pad pattern UP may be an under-pad pattern of the second lower pad 260. The second lower pads 260 may have plate (e.g., planar) shapes. According to some embodiments, the second lower pads 260 may each have a T shaped cross-section including a via part and a pad part on the via part, which via and pad parts are connected into a single unitary piece. The second lower pads 260 may include a metallic material. For example, the second lower pads 260 may include copper (Cu).

The second lower passivation layer 270 may be disposed on the device interlayer dielectric layer 226. On the bottom surface of the device interlayer dielectric layer 226, the second lower passivation layer 270 may cover the device wiring part 224. The second lower passivation layer 270 may have a substantially flat (e.g., planar) bottom surface. As the device interlayer dielectric layer 226 has a wavy shape on the bottom surface thereof, the second lower passivation layer 270 may be uneven on its top surface in contact with the device interlayer dielectric layer 226. For example, the bottom surface of the second lower passivation layer 270 may have a wavy shape. The second lower passivation layer 270 may have a thickness that is changed based on position. For example, the second lower passivation layer 270 may have a first thickness t1 or a maximum thickness at a valley on the bottom surface of the device interlayer dielectric layer 226 and a second thickness t2 or a minimum thickness at a ridge on the bottom surface of the device interlayer dielectric layer 226. A range of about 50 Å to about 500 Å may be given to a difference between the second thickness t2 and the first thickness t1, or a deviation between maximum and minimum values of the thickness of the second lower passivation layer 270. On the bottom surface of the device interlayer dielectric layer 226, the second lower passivation layer 270 may surround the second lower pads 260. The second lower pads 260 may be exposed by the second lower passivation layer 270. For example, when viewed in a plan view, the second lower passivation layer 270 may surround, but not contact, the second lower pads 260. One pad layer may be constituted by the second lower pads 260 and the second lower passivation layer 270. The bottom surface of the second lower passivation layer 270 may be coplanar with those of the second lower pads 260. The second lower passivation layer 270 may include one of silicon nitride (SiN), silicon oxide (SiO), silicon carboxide (SiOC), silicon oxynitride (SiON), and silicon carbonitride (SiCN). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second upper pads 240 may be disposed on the second surface 210*b* of the second semiconductor substrate 210. Some of the second upper pads 240 may be connected to the second vias 230. For example, the second vias 230 may vertically penetrate the second semiconductor substrate 210 to be coupled to bottom surfaces of the second upper pads 240. The second upper pads 240 may have plate (e.g., planar) shapes. According to some embodiments, the second upper pads 240 may each have a T shaped cross-section including a via part and a pad part on the via part, which via and pad parts are connected into a single unitary piece. The second upper pads 240 may include a metallic material. For example, the second upper pads 240 may include copper (Cu).

The second upper passivation layer 250 may be disposed on the second surface 210*b* of the second semiconductor substrate 210. The second upper passivation layer 250 may have a substantially flat (e.g., planar) top surface. As the second semiconductor substrate 210 has a wavy shape on the second surface 210*b* thereof, the second upper passivation layer 250 may be uneven on its bottom surface in contact with the second semiconductor substrate 210. For example, the bottom surface of the second upper passivation layer 250 may have a wavy shape. The second upper passivation layer 250 may have a thickness that is changed based on position. For example, the second upper passivation layer 250 may have a third thickness or a maximum thickness at a valley on the bottom surface 210*b* of the second semiconductor substrate 210 and a fourth thickness or a minimum thickness at a ridge on the bottom surface 210*b* of the second semiconductor substrate 210. A range of about 50 Å to about 500 Å may be given to a difference between the fourth and third thicknesses, or a deviation between maximum and minimum values of the thickness of the second upper passivation layer 250. On the second semiconductor substrate 210, the second upper passivation layer 250 may surround the second upper pads 240. The second upper pads 240 may be exposed by the second upper passivation layer 250. For example, when viewed in a plan view, the second upper passivation layer 250 may surround, but not contact, the second upper pads 240. One pad layer may be constituted by the second upper pads 240 and the second upper passivation layer 250. The top surface of the second upper passivation layer 250 may be coplanar with those of the second upper pads 240. The second upper passivation layer 250 may include one of high-density plasma (HDP) oxide, undoped silicate glass (USG), tetraethyl orthosilicate (TEOS), silicon nitride (SiN), silicon oxide (SiO), silicon carboxide (SiOC), silicon oxynitride (SiON), and silicon carbonitride (SiCN). The second upper passivation layer 250 may have a mono-layered structure or a multi-layered structure.

The intermediate semiconductor chips 202*a* and 202*b* may have substantially the same structure as that of the lower semiconductor chip 201. For example, each of the intermediate semiconductor chips 202*a* and 202*b* may include the second semiconductor substrate 210, the second circuit layer 220, the second via 230, the second upper pad 240, the second upper passivation layer 250, the second lower pad 260, and the second lower passivation layer 270.

The upper semiconductor chip 203 may have substantially similar structure to that of the lower semiconductor chip 201. For example, the upper semiconductor chip 203 may include the second semiconductor substrate 210, the second circuit layer 220, the second lower pad 260, and the second lower passivation layer 270. The upper semiconductor chip 203 may not have any of the second via 230, the second upper pad 240, and the second upper passivation layer 250. Aspects of the present inventive concept, however, are not limited thereto. According to some embodiments of the present inventive concept, the upper semiconductor chip 203 may include at least one selected from the second via 230, the second upper pad 240, and the second upper passivation layer 250. The upper semiconductor chip 203 may have a thickness greater than that of the lower semiconductor chip 201 and those of the intermediate semiconductor chips 202*a* and 202*b*.

The intermediate semiconductor chips 202*a* and 202*b* and the upper semiconductor chip 203 may be sequentially mounted on the lower semiconductor chip 201. The semiconductor chips 201, 202*a*, 202*b*, and 203 of the chip stack CS may be mounted in the same method. With regard to the mounting of the semiconductor chips 201, 202*a*, 202*b*, and 203, the following will describe in detail the mounting of the lower semiconductor chip 201 and one 202*a* among the intermediate semiconductor chips 202*a* and 202*b* of the chip stack CS.

The intermediate semiconductor chip 202*a* may be disposed on the lower semiconductor chip 201. The second upper pads 240 of the lower semiconductor chip 201 may be vertically aligned with the second lower pads 260 of the intermediate semiconductor chip 202*a*. The lower semiconductor chip 201 and the intermediate semiconductor chip 202*a* may be in contact with each other.

On an interface between the lower semiconductor chip 201 and the intermediate semiconductor chip 202*a*, the second upper passivation layer 250 of the lower semiconductor chip 201 may be bonded to the second lower passivation layer 270 of the intermediate semiconductor chip 202*a*. In this case, the second upper passivation layer 250 and the second lower passivation layer 270 may constitute a hybrid bonding of oxide, nitride, or oxynitride. In this description, the term "hybrid bonding" may denote a bonding in which two components of the same kind are merged at an interface therebetween. For example, the bonded second upper and lower passivation layers 250 and 270 may have a continuous configuration, and an invisible interface may be provided between the second upper and lower passivation layers 250 and 270. The second upper passivation layer 250 and the second lower passivation layer 270 may be formed of the same material and may have no interface therebetween. In such a case, the second upper passivation layer 250 and the second lower passivation layer 270 may be provided in the form of a single component. For example, the second upper passivation layer 250 and the second lower passivation layer 270 may be combined to constitute a single unitary piece. Aspects of the present inventive concept, however, are not limited thereto. The second upper passivation layer 250 and the second lower passivation layer 270 may be formed of different materials from each other. The second upper passivation layer 250 and the second lower passivation layer 270 may not have a continuous configuration and may have a visible interface therebetween.

According to some embodiments of the present inventive concept, even though the semiconductor chips 201, 202*a*, 202*b*, and 203 have second semiconductor substrates 210 each of which is bent, the second upper passivation layer 250 and the second lower passivation layer 270 may have flat (e.g., planar) shapes. A flat (e.g., planar) contact surface may be provided between the second upper passivation layer 250 of the lower semiconductor chip 201 and the second lower passivation layer 270 of the intermediate semiconductor chip 202a, and no interval may be present between the second upper passivation layer 250 and the second lower passivation layer 270. Therefore, good contact may be provided between the second upper passivation layer 250 and the second lower passivation layer 270, or between the semiconductor chips 201, 202a, 202b, and 203, and a semiconductor package may have improved structural stability.

The lower semiconductor chip 201 may be connected to the intermediate semiconductor chip 202a. For example, the lower semiconductor chip 201 and the intermediate semiconductor chip 202a may be in contact with each other. On an interface between the lower semiconductor chip 201 and the intermediate semiconductor chip 202a, the second upper pads 240 of the lower semiconductor chip 201 may be bonded to the second lower pads 260 of the intermediate semiconductor chip 202a. In this case, the second upper and lower pads 240 and 260 may constitute an intermetallic hybrid bonding therebetween. The bonded second upper and lower pads 240 and 260 may have a continuous configuration and may have an invisible interface therebetween. For example, the second upper and lower pads 240 and 260 may be formed of the same material and may have no interface therebetween. Therefore, the second upper and lower pads 240 and 260 may be provided in the form of one component. For example, the second upper and lower pads 240 and 260 may be combined to constitute a single unitary piece.

According to some embodiments of the present inventive concept, a flat (e.g., planar) contact surface may be provided between the second upper passivation layer 250 of the lower semiconductor chip 201 and the second lower passivation layer 270 of the intermediate semiconductor chip 202a, and no spacing may be present between the second upper pads 240 and the second lower pads 260. Therefore, good contact may be provided between the second upper pads 240 and the second lower pads 260, and a semiconductor package may be provided which has an excellent electrical connection between the semiconductor chips 201, 202a, 202b, and 203.

The chip stack S may be mounted on the first semiconductor chip 100. The chip stack CS may be disposed on the first semiconductor chip 100. The first upper pads 140 of the first semiconductor chip 100 may be vertically aligned with the second lower pads 260 of the lower semiconductor chip 201. The first semiconductor chip 100 and the lower semiconductor chip 201 may be in contact with each other.

On an interface between the first semiconductor chip 100 and the lower semiconductor chip 201, the first upper passivation layer 150 of the first semiconductor chip 100 may be bonded to the second lower passivation layer 270 of the lower semiconductor chip 201. In this configuration, the first upper passivation layer 150 and the second lower passivation layer 270 may constitute a hybrid bonding of oxide, nitride, or oxynitride. For example, the first upper passivation layer 150 and the second lower passivation layer 270 may be formed of the same material and may have no interface therebetween. Thus, the first upper passivation layer 150 and the second lower passivation layer 270 may be provided in the form of one component.

The first semiconductor chip 100 may be connected to the lower semiconductor chip 201. For example, the first semiconductor chip 100 and the lower semiconductor chip 201 may be in contact with each other. On an interface between the first semiconductor chip 100 and the lower semiconductor chip 201, the first upper pads 140 of the first semiconductor chip 100 may be bonded to the second lower pads 260 of the lower semiconductor chip 201. In this configuration, the first upper pad 140 and the second lower pad 260 may constitute an intermetallic hybrid bonding therebetween. For example, the bonded first upper pad 140 and second lower pad 260 may have a continuous configuration and may have an invisible interface therebetween. The first upper pad 140 and the second lower pad 260 may be provided in the form of one component.

According to some embodiments, the chip stack CS may be mounted on the first semiconductor chip 100 through connection terminals such as solder balls. The connection terminals may be disposed between and connect the first upper pads 140 and the second lower pads 260. In this case, an under-fill material may be provided to a space between the chip stack CS and the first semiconductor chip 100, and the under-fill material may surround the connection terminals.

A molding layer 300 may be provided on the first semiconductor chip 100, and the molding layer 300 may cover a top surface of the first semiconductor chip 100. The molding layer 300 may surround the chip stack CS. The molding layer 300 may cover lateral surfaces of the semiconductor chips 201, 202a, 202b, and 203. The molding layer 300 may protect the chip stack CS. The molding layer 300 may include a dielectric material. For example, the molding layer 300 may include an epoxy molding compound (EMC). Differently from that shown, the molding layer 300 may be formed to cover the chip stack CS. For example, the molding layer 300 may cover a rear surface of the upper semiconductor chip 203.

In the embodiments that follow, a detailed description of technical features repetitive to those discussed above with reference to FIGS. 1 to 3 will be omitted, and a difference thereof will be discussed in detail. The same reference numerals may be allocated to the same components as those of the semiconductor package discussed above according to some embodiments of the present inventive concept.

Figure 4:
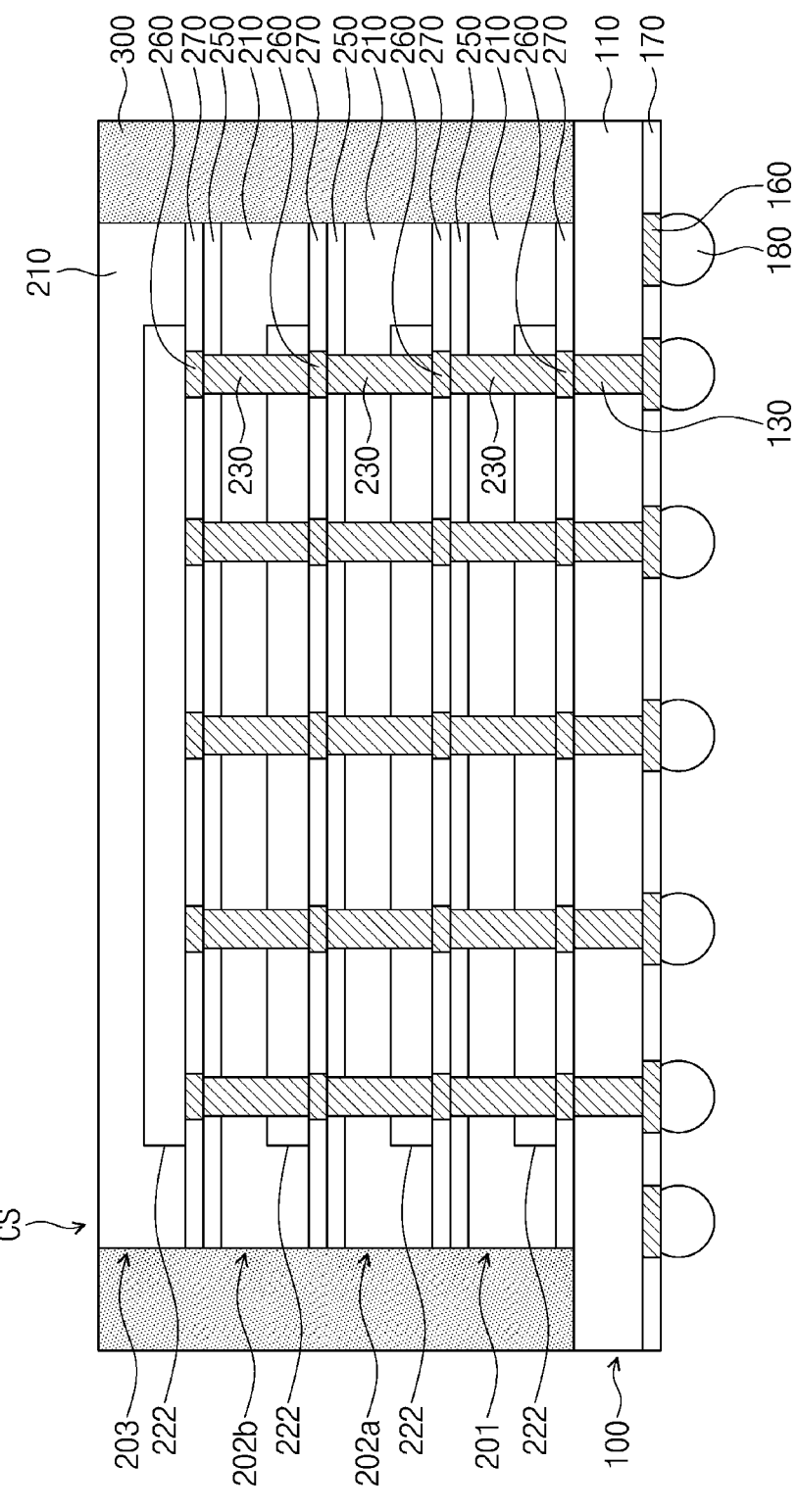
FIG. 4 illustrates a cross-sectional view showing a semiconductor package according to some example embodiments of the present inventive concept.
Figure 5:
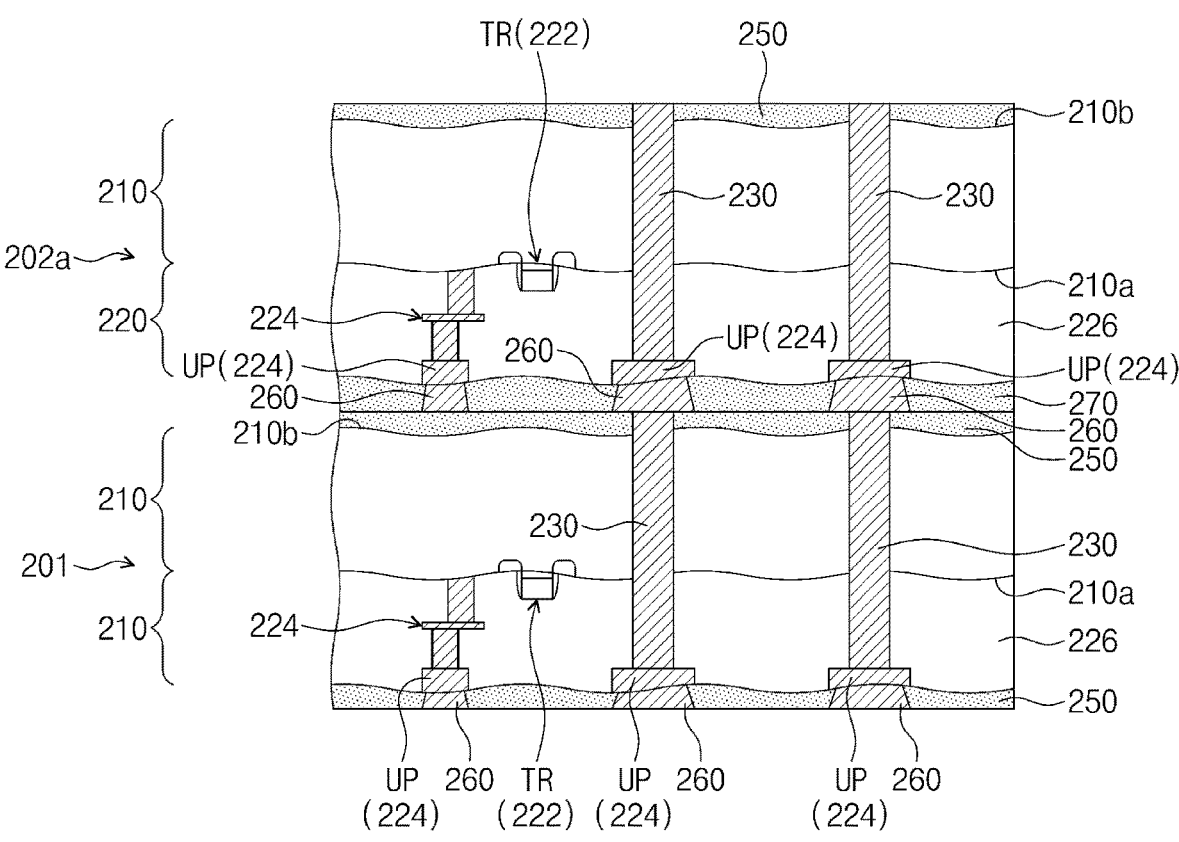
FIG. 5 illustrates a cross-sectional view showing a bonding between semiconductor chips.

FIG. 4 illustrates a cross-sectional view showing a semiconductor package according to some example embodiments of the present inventive concept. FIG. 5 illustrates a cross-sectional view showing a bonding between semiconductor chips.

Referring to FIGS. 4 and 5, the lower semiconductor chip 201 may include the second semiconductor substrate 210, the second circuit layer 220, the second via 230, the second upper passivation layer 250, the second lower pad 260, and the second lower passivation layer 270. In comparison with the lower semiconductor chip 201 of FIGS. 2 and 3, the lower semiconductor chip 201 of FIGS. 4 and 5 may not have the second upper pad 240.

The second vias 230 may be exposed on a top surface of the second upper passivation layer 250. The second vias 230 may have top surfaces coplanar with that of the second upper passivation layer 250.

The intermediate semiconductor chips 202a and 202b may have substantially the same structure as that of the lower semiconductor chip 201. For example, each of the intermediate semiconductor chips 202a and 202b may include the second semiconductor substrate 210, the second circuit layer 220, the second via 230, the second upper passivation layer 250, the second lower pad 260, and the second lower passivation layer 270.

The intermediate semiconductor chips 202a and 202b and the upper semiconductor chip 203 may be sequentially mounted on the lower semiconductor chip 201. The semiconductor chips 201, 202a, 202b, and 203 of the chip stack CS may be mounted in the same method.

The intermediate semiconductor chip 202a may be disposed on the lower semiconductor chip 201. The second vias 230 of the lower semiconductor chip 201 may be vertically aligned with the second lower pads 260 of the intermediate semiconductor chip 202a. The lower semiconductor chip 201 and the intermediate semiconductor chip 202a may be in contact with each other.

The lower semiconductor chip 201 may be connected to the intermediate semiconductor chip 202a. For example, the lower semiconductor chip 201 and the intermediate semiconductor chip 202a may be in contact with each other. On an interface between the lower semiconductor chip 201 and the intermediate semiconductor chip 202a, the second vias 230 of the lower semiconductor chip 201 may be bonded to the second lower pads 260 of the intermediate semiconductor chip 202a. In this case, the second via 230 and second lower pad 260 may constitute an intermetallic hybrid bonding therebetween. For example, the second via 230 and the second lower pad 260 that are bonded to each other may have a continuous configuration and may have an invisible interface between the second via 230 and the second lower pad 260. The second via 230 and the second lower pad 260 may be formed of the same material and may have no interface therebetween. Thus, the second via 230 and the second lower pad 260 may be provided in the form of one component. For example, the second via 230 and the second lower pad 260 may be merged into a single unitary piece.

Figure 6:
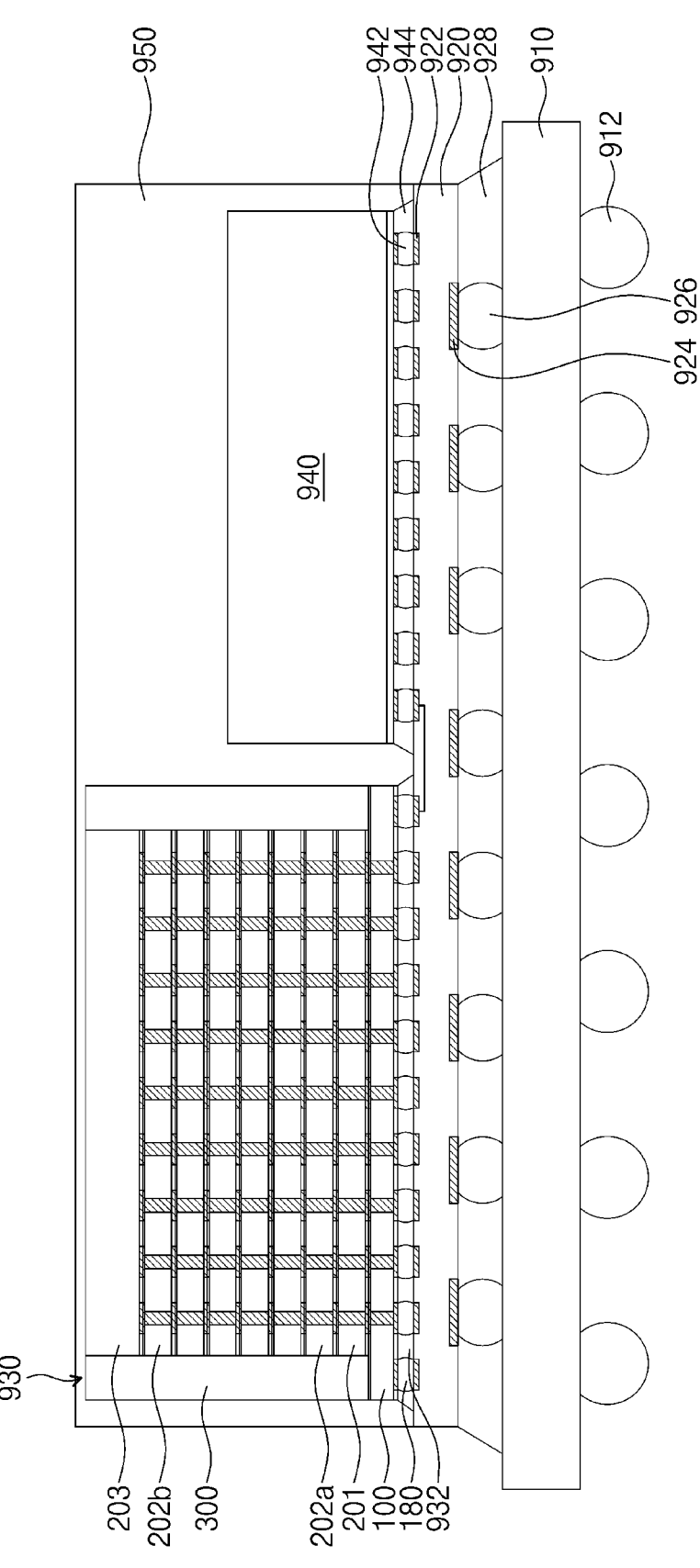
FIG. 6 illustrates a cross-sectional view showing a semiconductor module according to some example embodiments of the present inventive concept.

FIG. 6 illustrates a cross-sectional view showing a semiconductor module according to some example embodiments of the present inventive concept.

Referring to FIG. 6, a semiconductor module may be, for example, a memory module including a module substrate 910, a chip stack package 930 and a graphic processing unit 940 that are mounted on the module substrate 910, and an outer molding layer 950 that covers the chip stack package 930 and the graphic processing unit 940. The semiconductor module may further include an interposer 920 provided on the module substrate 910.

The module substrate 910 may be provided. The module substrate 910 may include a printed circuit board (PCB) having a signal pattern on a top surface thereof.

The module substrate 910 may be provided with module terminals 912 thereunder. The module terminals 912 may be solder balls or solder bumps, and based on type of the module substrate 910, the module terminals 912 may be provided in the shape of one of a ball grid array (BGA) type, a fine ball-grid array (FBGA) type, and a land grid array (LGA) type.

The interposer 920 may be provided on the module substrate 910. The interposer 920 may include first substrate pads 922 exposed on a top surface of the interposer 920 and second substrate pads 924 exposed on a bottom surface of the interposer 920. The interposer 920 may redistribute the chip stack package 930 and the graphic processing unit 940. The interposer 920 may be flip-chip mounted on the module substrate 910. For example, the interposer 920 may be mounted on the module substrate 910 through substrate terminals 926 provided on the second substrate pads 924. The substrate terminals 926 may include solder balls or solder bumps. A first under-fill layer 928 may be provided between the module substrate 910 and the interposer 920.

The chip stack package 930 may be disposed on the interposer 920. The chip stack package 930 may have a structure the same as or similar to that of the semiconductor package discussed with reference to FIGS. 1 to 5.

The chip stack package 930 may be mounted on the interposer 920. For example, the chip stack package 930 may be coupled through the external terminals 180 of the first semiconductor chip 100 to the first substrate pads 922 of the interposer 920. A second under-fill layer 932 may be provided between the chip stack package 930 and the interposer 920. The second under-fill layer 932 may fill a space between the interposer 920 and the first semiconductor chip 100 and may surround the external terminals 180 of the first semiconductor chip 100.

The graphic processing unit 940 may be disposed on the interposer 920. The graphic processing unit 940 may be disposed spaced apart from the chip stack package 930. The graphic processing unit 940 may have a thickness greater than those of the semiconductor chips 100, 201, 202a, 202b, and 203 of the chip stack package 930. The graphic processing unit 940 may include a logic circuit. For example, the graphic processing unit 940 may be a logic chip. The graphic processing unit 940 may be provided with bumps 942 on a bottom surface thereof. For example, the graphic processing unit 940 may be coupled through the bumps 942 to the first substrate pads 922 of the interposer 920. A third under-fill layer 944 may be provided between the interposer 920 and the graphic processing unit 940. The third under-fill layer 944 may surround the bumps 942 while filling a space between the interposer 920 and the graphic processing unit 940.

The outer molding layer 950 may be provided on the interposer 920. The outer molding layer 950 may cover the top surface of the interposer 920. The outer molding layer 950 may encapsulate the chip stack package 930 and the graphic processing unit 940. The outer molding layer 950 may have a top surface located at the same level as that of a top surface of the chip stack package 930. The outer molding layer 950 may include a dielectric material. For example, the outer molding layer 950 may include an epoxy molding compound (EMC).

FIGS. 7A to 17A illustrate cross-sectional views showing a method of fabricating a semiconductor package according to some example embodiments of the present inventive concept. FIGS. 7B to 17B illustrate cross-sectional views showing a method of fabricating a semiconductor package according to some example embodiments of the present inventive concept.

Figure 7A:
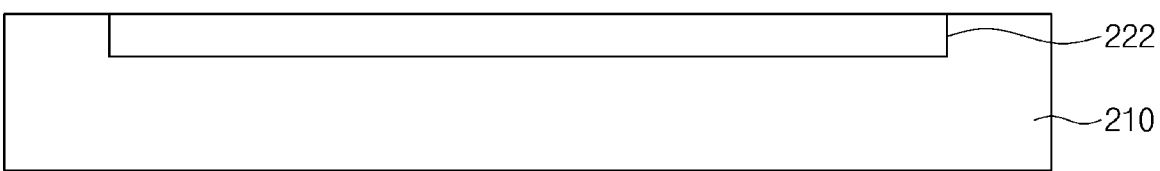
Figure 7B:
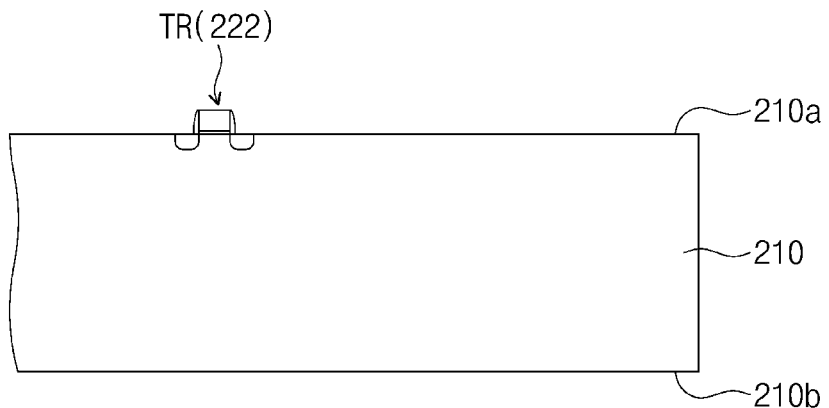

Referring to FIGS. 7A and 7B, a wafer may be provided. The wafer may correspond to a semiconductor substrate 210 of FIGS. 7A and 7B. Hereinafter, the wafer will be referenced as the semiconductor substrate 210. A typical process may be performed to form semiconductor elements 222 on a front surface 210a of the semiconductor substrate 210. For example, a source and a drain may be formed on an upper portion of the semiconductor substrate 210, and a gate dielectric layer and a gate electrode may be formed between the source and the drain, with the result that transistors TR may be formed. The semiconductor substrate 210 may correspond to the second semiconductor substrate 210 discussed with reference to FIGS. 1 to 5.

Figure 8A:
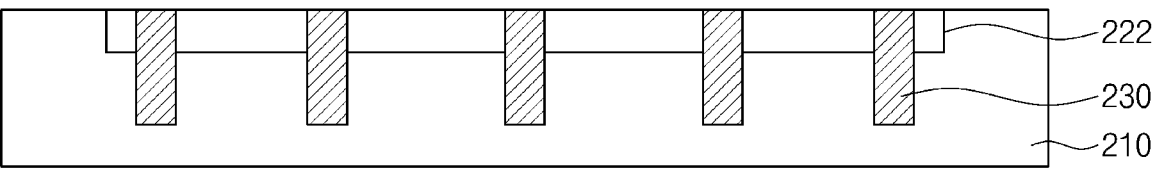
Figure 8B:
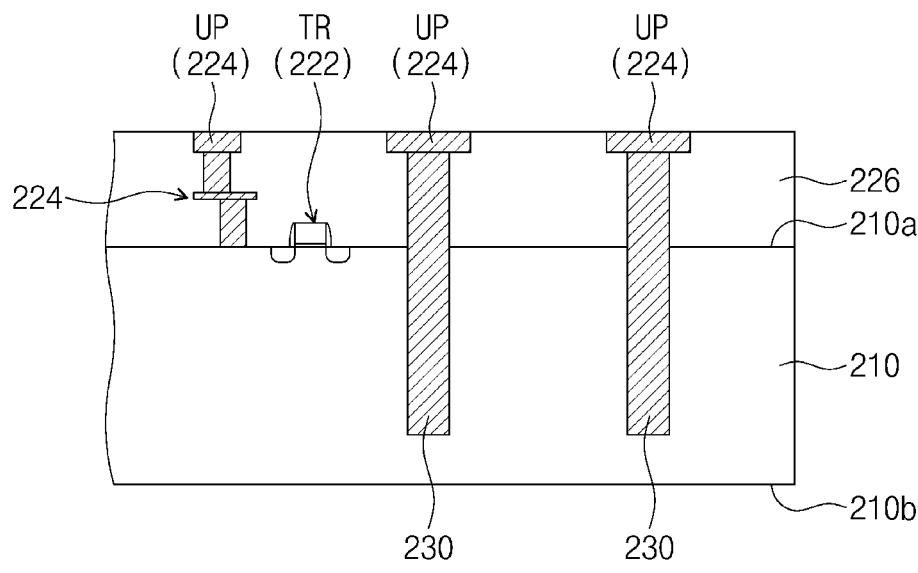

Referring to FIGS. 8A and 8B, a device interlayer dielectric layer 226 and a device wiring part 224 may be formed on the front surface 210a of the semiconductor substrate 210. The device wiring part 224 may be electrically connected to the transistors TR.

A dielectric material may be deposited on the front surface 210a of the semiconductor substrate 210 to form a lower portion of the device interlayer dielectric layer 226. Connection contacts may be formed to penetrate the lower portion of the device interlayer dielectric layer 226 to come into connection with the semiconductor substrate 210, and the device wiring part 224 may be formed on the lower portion of the device interlayer dielectric layer 226. A dielectric material may be deposited on the lower portion of the device interlayer dielectric layer 226 to form an upper portion of the device interlayer dielectric layer 226. Connection contacts may be formed to penetrate the device interlayer dielectric layer 226 to come into connection with the device wiring part 224.

Vias 230 may be formed to vertically penetrate the device interlayer dielectric layer 226 and the semiconductor substrate 210. For example, via holes may be formed in the device interlayer dielectric layer 226 and the semiconductor substrate 210, and the via holes may be filled with a conductive material to form the vias 230. The via holes may not completely penetrate the semiconductor substrate 210. The vias 230 may be exposed on a top surface of the device interlayer dielectric layer 226 and may not be exposed on a rear surface 210*b* of the semiconductor substrate 210. The vias 230 may correspond to the second vias 230 discussed with reference to FIGS. 1 to 5.

An under-pad pattern UP may be formed on the device interlayer dielectric layer 226 to be connected to the connection contacts and the vias 230.

Figure 9A:
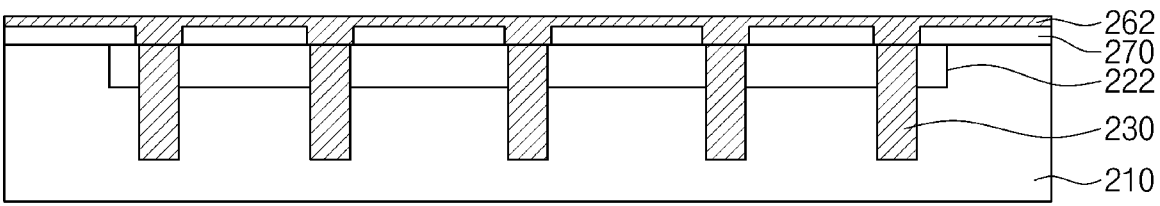
Figure 9B:
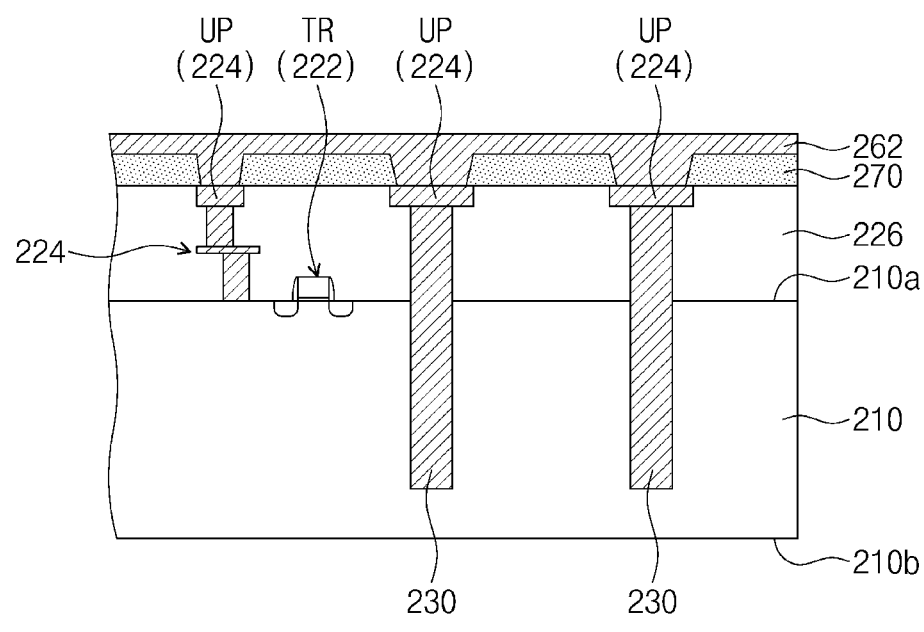

Referring to FIGS. 9A and 9B, a first passivation layer 270 may be formed on the device interlayer dielectric layer 226. A dielectric layer may be formed to cover the device interlayer dielectric layer 226 and the under-pad pattern UP, and then the dielectric layer may be patterned to form the first passivation layer 270. The patterning process may cause the first passivation layer 270 to have recesses that are formed to expose the under-pad pattern UP.

A conductive layer 262 may be formed on the first passivation layer 270. The conductive layer 262 may cover the first passivation layer 270 and may cover the recesses. For example, a seed layer may be formed on the first passivation layer 270 to conformally cover a top surface of the first passivation layer 270 and inner sides of the recesses, and then the seed layer may be used as a seed to perform a plating process to form the conductive layer 262. The conductive layer 262 may include a conductive material, such as copper (Cu).

Figure 10A:
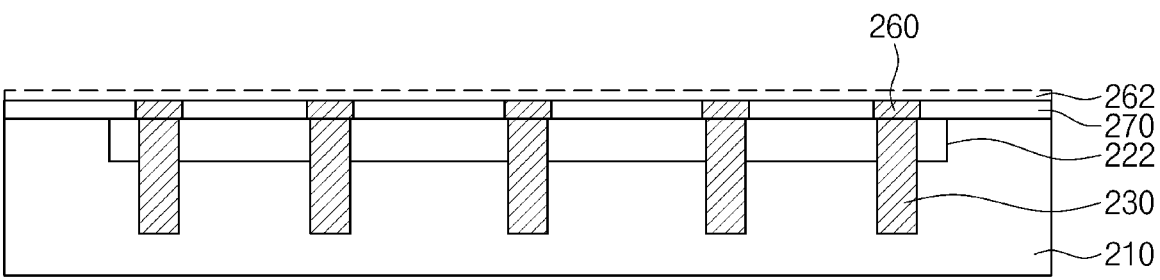
Figure 10B:
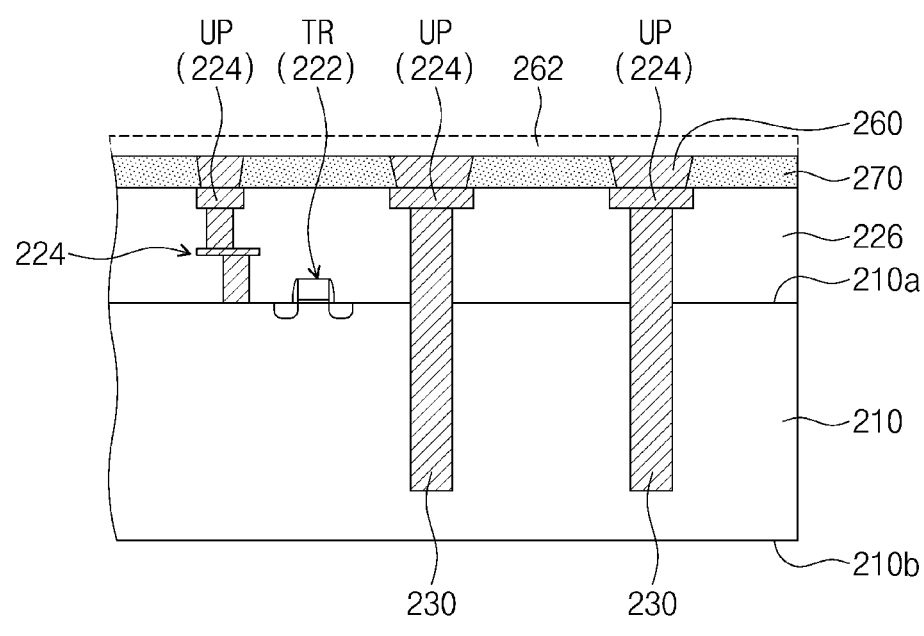

Referring to FIGS. 10A and 10B, a first planarization process may be performed on the conductive layer 262. For example, the first planarization process may include a chemical mechanical polishing (CMP) process. The first planarization process may continue until the top surface of the first passivation layer 270 is exposed. In the first planarization process, the conductive layer 262 may be separated to form first pads 260. After the first planarization process, the top surface of the first passivation layer 270 may be coplanar with those of the first pads 260. The first passivation layer 270 and the first pads 260 may have substantially flat (e.g., planar) top surfaces. The first pads 260 and the first passivation layer 270 may correspond to the second lower pads 260 and the second lower passivation layer 270 that are discussed with reference to FIGS. 1 to 5. The first pads 260 and the first passivation layer 270 may be referred to herein as a "first pad layer."

Figure 11A:
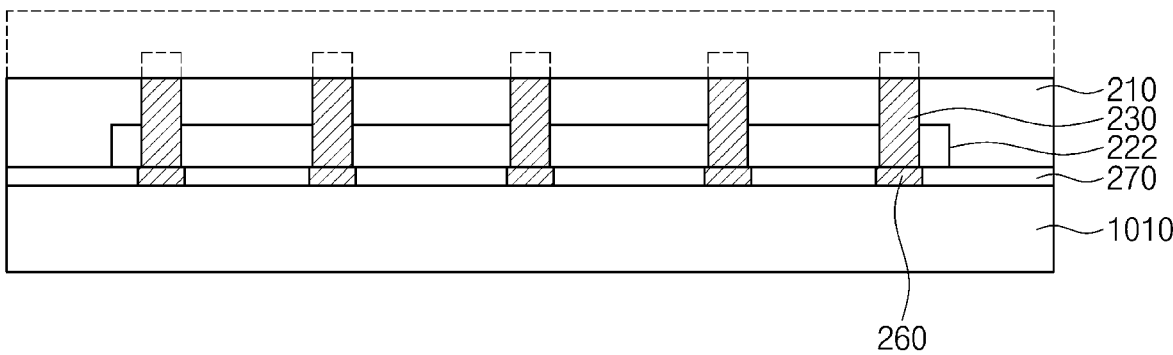
Figure 11B:
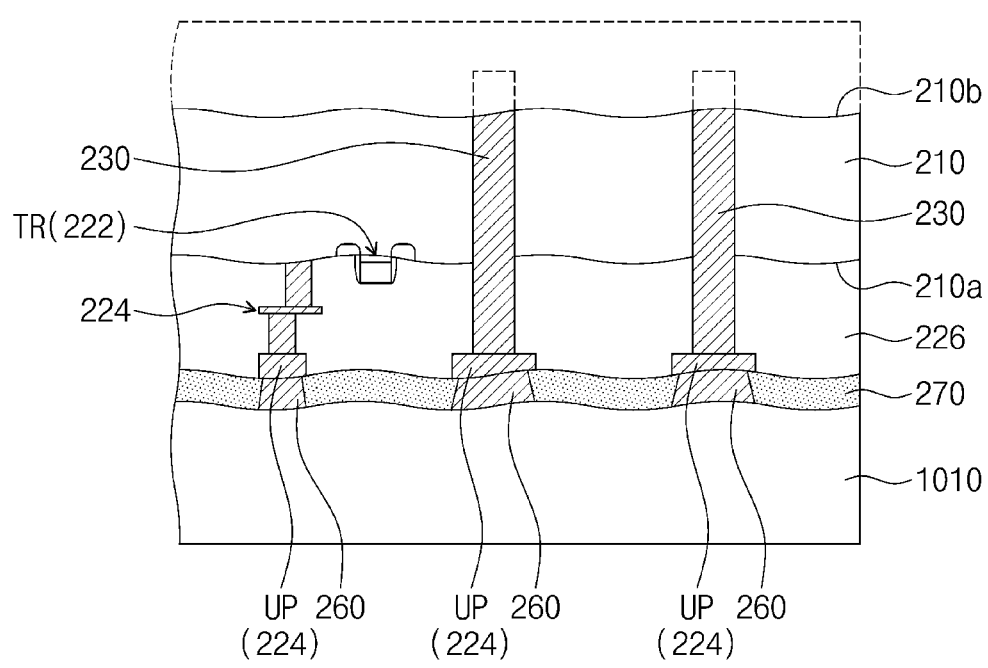

Referring to FIGS. 11A and 11B, the semiconductor substrate 210 may be provided on a first carrier substrate 1010. The first carrier substrate 1010 may be a dielectric substrate including glass or polymer, or may be a conductive substrate including metal. An adhesive member may be provided on a top surface of the first carrier substrate 1010. For example, the adhesive member may include a glue tape. The semiconductor substrate 210 may be attached to the first carrier substrate 1010 to allow the first passivation layer 270 and the first pads 260 to face toward the first carrier substrate 1010.

The semiconductor substrate 210 may undergo a thinning process. For example, the thinning process may include a chemical mechanical polishing (CMP) process. The thinning process may be performed on the rear surface 210*b* of the semiconductor substrate 210. The thinning process may remove a portion at the rear surface 210*b* of the semiconductor substrate 210. The thinning process may also partially remove upper portions of the vias 230. After the thinning process, top surfaces of the vias 230 may be exposed.

In the thinning process, there may be an increase in stress or strain applied to the semiconductor substrate 210. Therefore, the thinning process may induce deformation of the semiconductor substrate 210. For example, the semiconductor substrate 210 may be uneven. In more detail, after the thinning process, each of the front and rear surfaces 210*a* and 210*b* of the semiconductor substrate 210 may have a wavy shape in which is repeated a series of concave shapes directed inwardly toward the semiconductor substrate 210 and convex shapes directed outwardly away from the semiconductor substrate 210. A range of about 50 Å to about 500 Å may be given to the degree of deformation of the semiconductor substrate 210, for example, a difference between top and bottom of the wavy shape. In addition, the thinning process may also induce deformation of the device interlayer dielectric layer 226, the first passivation layer 270, and the first pads 260. For example, after the thinning process, the device interlayer dielectric layer 226 may have a wavy shape on a bottom surface thereof, and the first passivation layer 270 and the first pads 260 may have wavy shapes on bottom surfaces thereof.

Figure 12A:
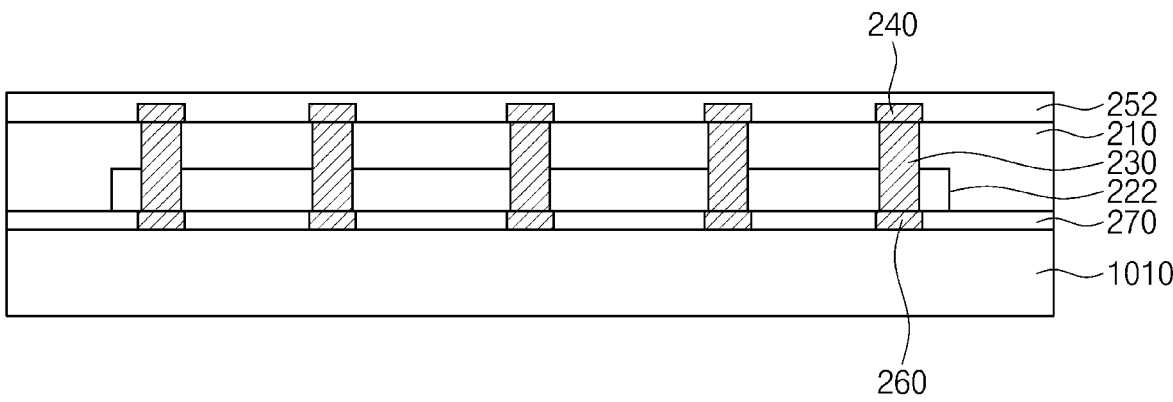
Figure 12B:
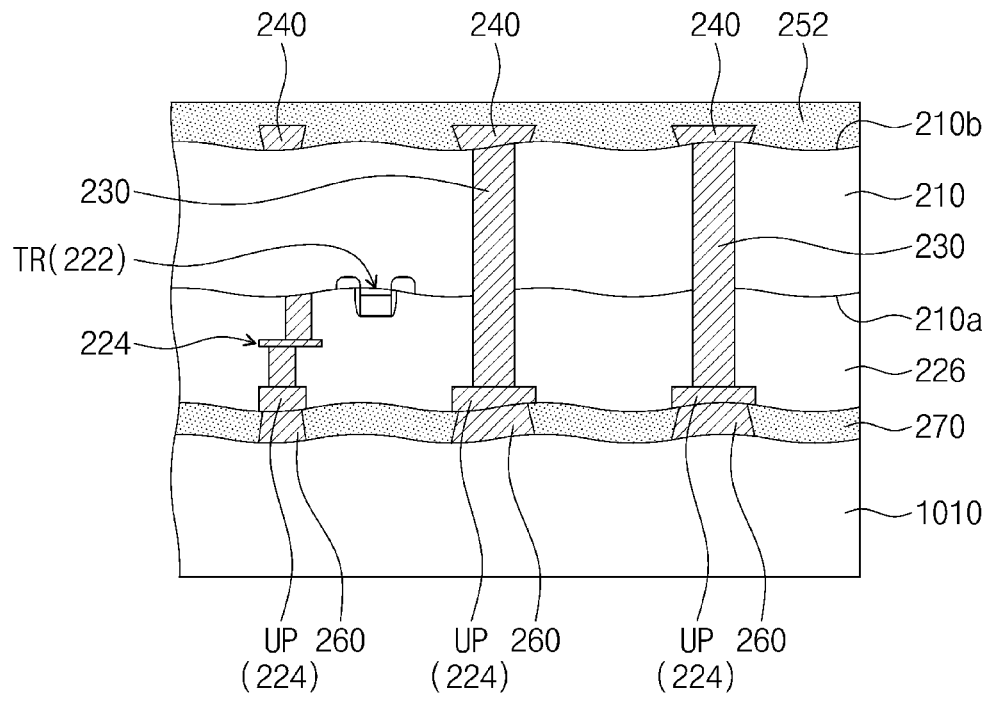

Referring to FIGS. 12A and 12B, second pads 240 may be formed on the semiconductor substrate 210. For example, a conductive layer may be formed on the rear surface 210*b* of the semiconductor substrate 210, and then the conductive layer may be patterned to form the second pads 240. The second pads 240 may be coupled to the vias 230.

A dielectric layer 252 may be formed on the semiconductor substrate 210. For example, a dielectric material may be deposited or coated on the rear surface 210*b* of the semiconductor substrate 210, thereby forming the dielectric layer 252. The dielectric layer 252 may cover the second pads 240 on the rear surface 210*b* of the semiconductor substrate 210.

Figure 13A:
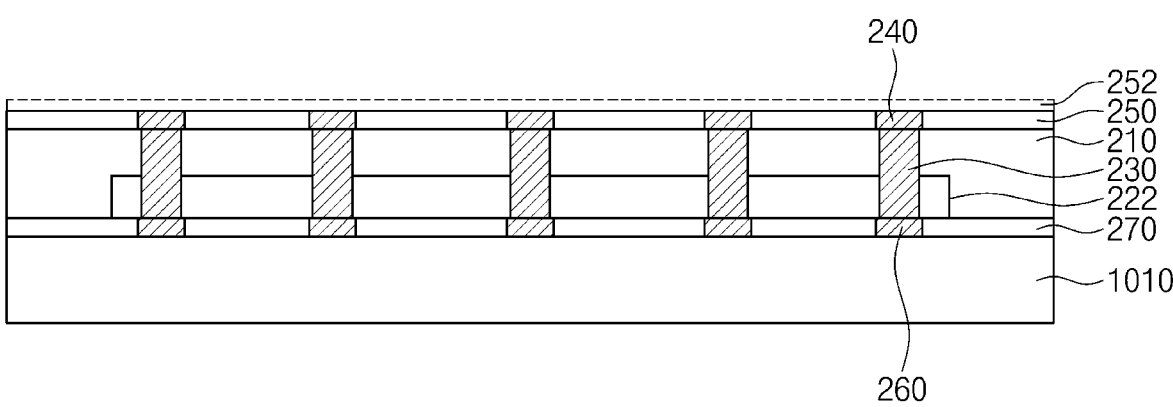
Figure 13B:
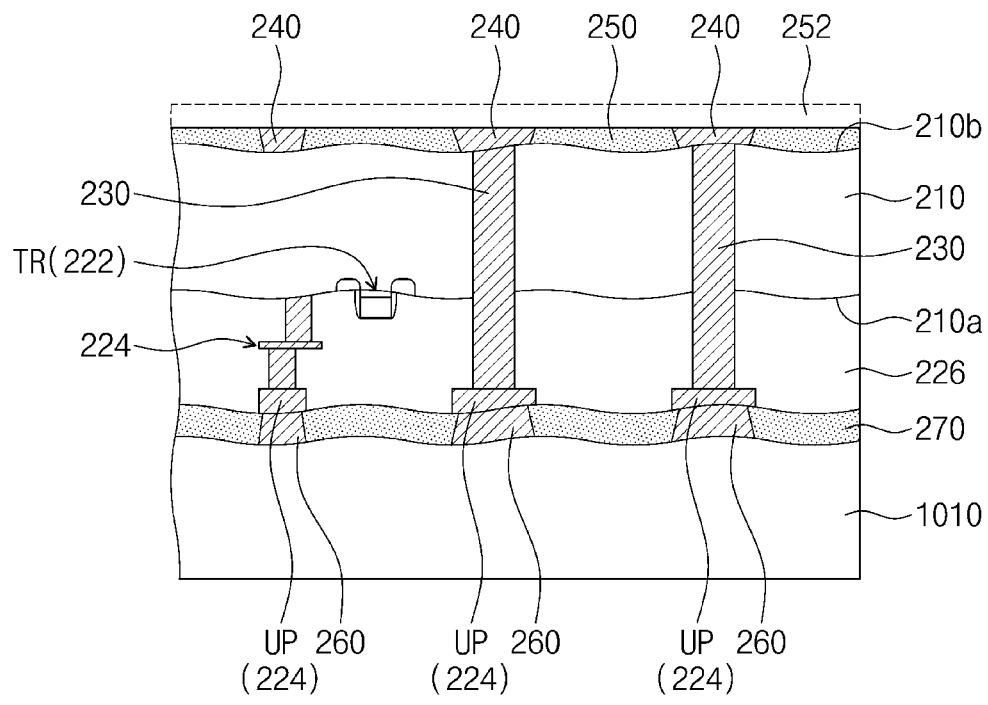

Referring to FIGS. 13A and 13B, a second planarization process may be performed on the dielectric layer 252. For example, the second planarization process may include a chemical mechanical polishing (CMP) process. The second planarization process may continue until top surfaces of the second pads 240 are exposed. The second planarization process may remove an upper portion of the dielectric layer 252, thereby forming a second passivation layer 250. After the second planarization process, the second passivation layer 250 may have a top surface coplanar with those of the second pads 240. The second passivation layer 250 and the second pads 240 may have substantially flat (e.g., planar) top surfaces. The second pads 240 and the second passivation layer 250 may correspond to the second upper pads 240 and the second upper passivation layer 250 that are discussed with reference to FIGS. 1 to 3. The second pads 240 and the second passivation layer 250 may be referred to herein as a "second pad layer."

As the semiconductor substrate 210 has the wavy shape on the rear surface 210*b*, the second passivation layer 250 may have a thickness that is changed based on position. For example, the second passivation layer 250 may be substantially flat (e.g., planar) on its top surface, and may have a wavy shape on its bottom surface in contact with the rear surface 210b of the semiconductor substrate 210.

Figure 14A:
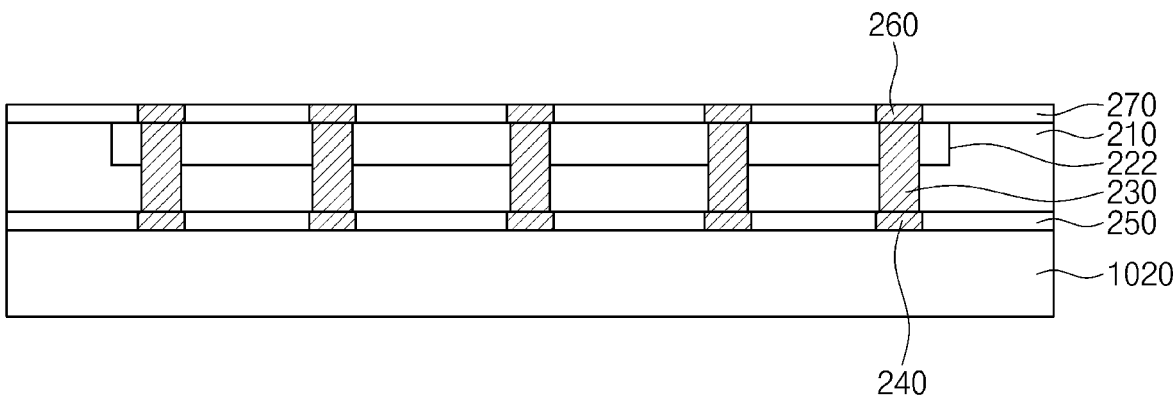
Figure 14B:
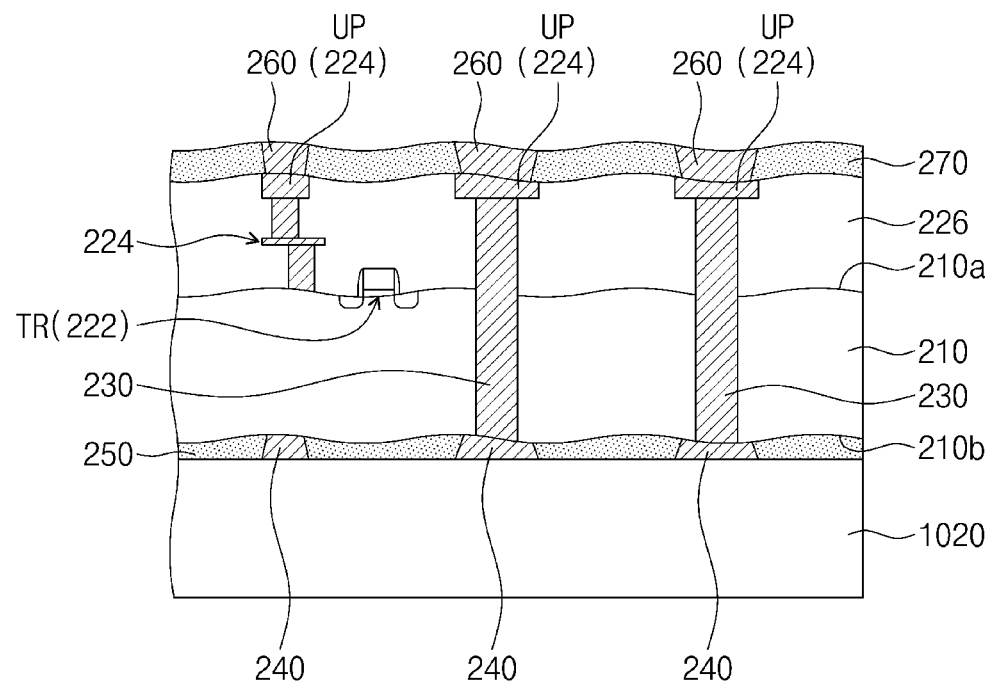

Referring to FIGS. 14A and 14B, the semiconductor substrate 210 may be provided on a second carrier substrate 1020. The second carrier substrate 1020 may be a dielectric substrate including glass or polymer, or may be a conductive substrate including metal. An adhesive member may be provided on a top surface of the second carrier substrate 1020. For example, the adhesive member may include a glue tape. The semiconductor substrate 210 may be attached to the second carrier substrate 1020 to allow the second passivation layer 250 and the second pads 240 to face toward the second carrier substrate 1020.

Thereafter, the first carrier substrate 1010 may be removed.

Figure 15A:
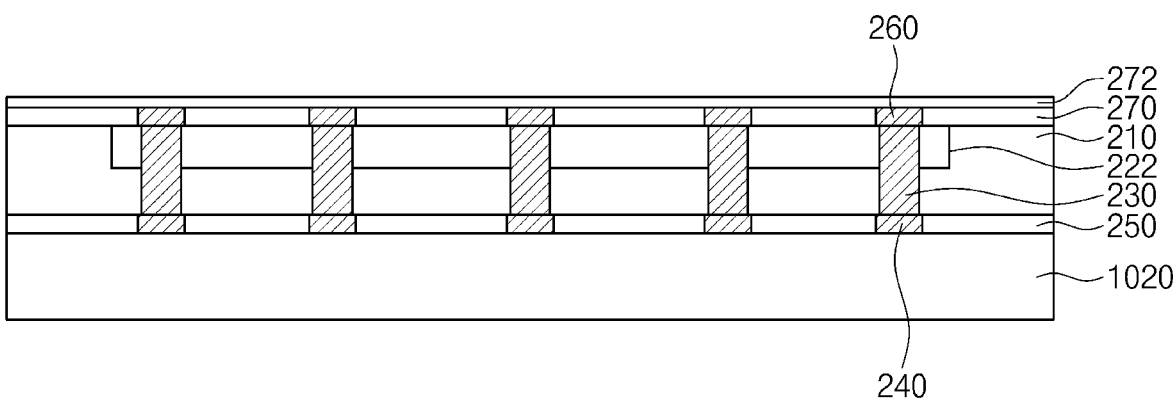
Figure 15B:
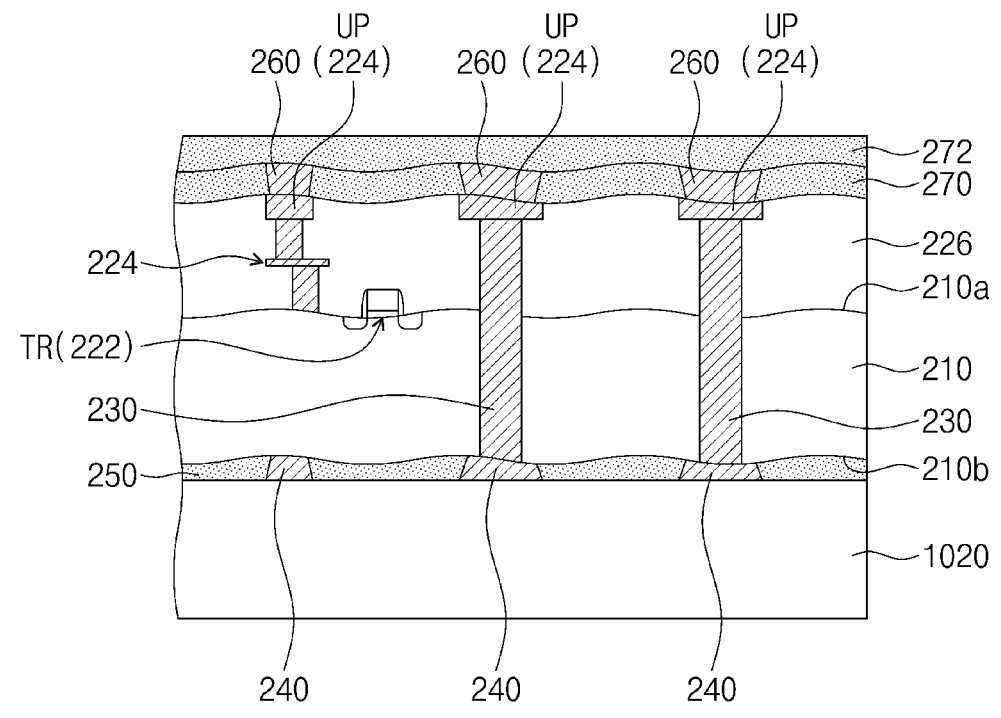

According to some embodiments, referring to FIGS. 15A and 15B, a dielectric layer 272 may be additionally formed on the first passivation layer 270. For example, a dielectric material may be deposited or coated on the first passivation layer 270, thereby forming the dielectric layer 272. The dielectric layer 272 may cover the first passivation layer 270 and the first pads 260. For example, the first pads 260 may be buried in the first passivation layer 270 and the dielectric layer 272. The dielectric layer 272 may include the same material as that of the first passivation layer 270.

Figure 16A:
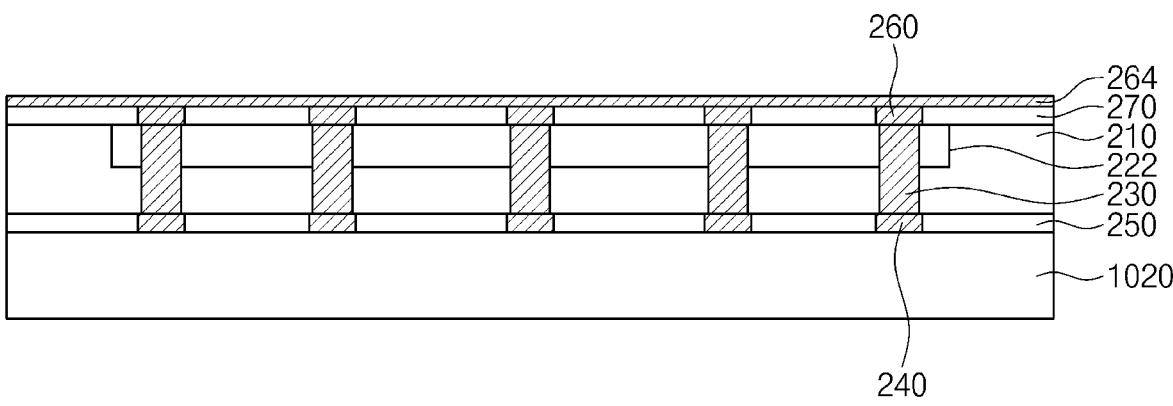
Figure 16B:
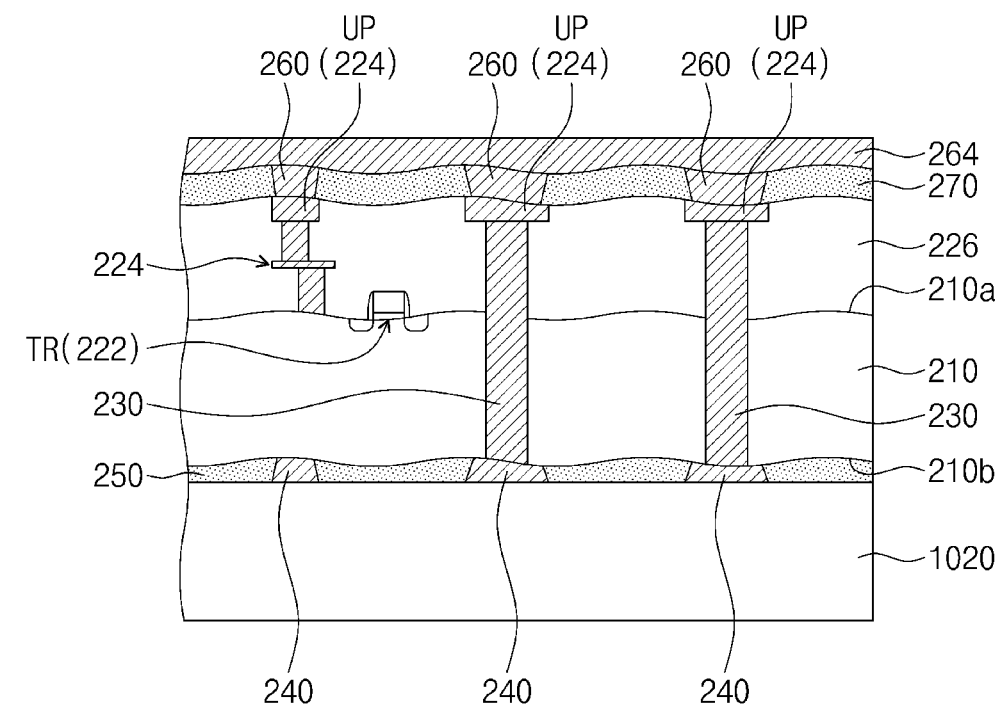

According to some embodiments, referring to FIGS. 16A and 16B, a conductive layer 264 may be additionally formed on the first passivation layer 270. For example, a seed layer may be formed on the first passivation layer 270, and then the seed layer may be used as a seed to perform a plating process to form the conductive layer 264. The conductive layer 264 may cover the top surface of the first passivation layer 270. The conductive layer 264 may include the same material as that of the first pads 260.

Figure 17A:
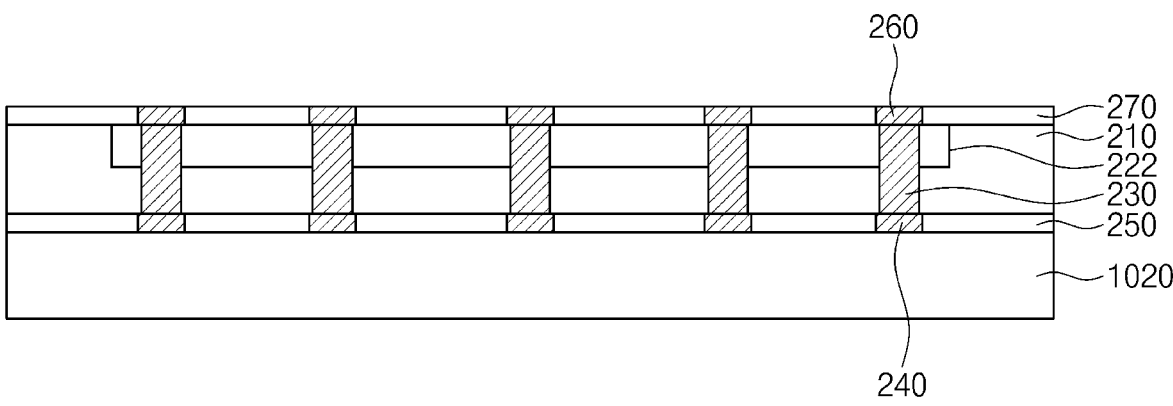
Figure 17B:
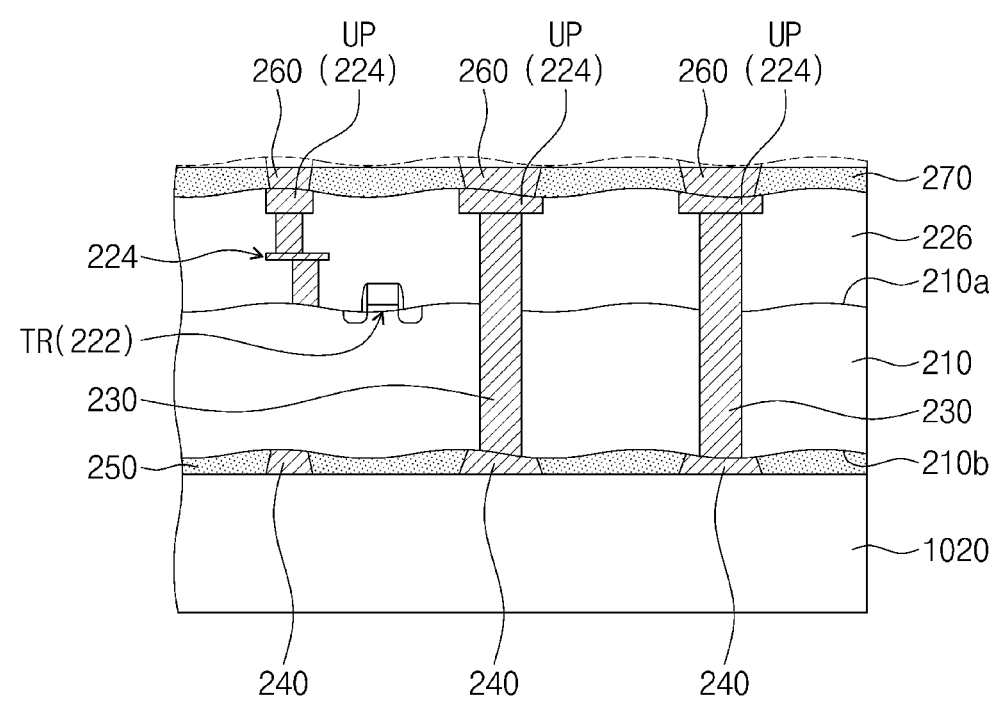

Referring to FIGS. 17A and 17B, a third planarization process may be performed on the first passivation layer 270. For example, the third planarization process may include a chemical mechanical polishing (CMP) process. After the third planarization process, the top surface of the first passivation layer 270 may be coplanar with those of the first pads 260. The third planarization process may cause the first passivation layer 270 and the first pads 260 to have substantially flat (e.g., planar) top surfaces.

As shown in the embodiment of FIGS. 15A and 15B, when the dielectric layer 272 is formed on the first passivation layer 270, the third planarization process may continue until the first pads 260 are exposed. As shown in the embodiment of FIGS. 16A and 16B, when the conductive layer 264 is formed on the first passivation layer 270, the third planarization process may continue until the first passivation layer 270 is exposed.

As a wavy shape is given to each of the front surface 210a of the semiconductor substrate 210 and the top surface of the device interlayer dielectric layer 226, the first passivation layer 270 may have a thickness that is changed based on position. For example, the first passivation layer 270 may be substantially flat (e.g., planar) on its top surface, and may have a wavy shape on its bottom surface in contact with the device interlayer dielectric layer 226.

Through the processes discussed above, a semiconductor chip may be formed. The semiconductor chip may be one of the semiconductor chips 201, 202a, 202b, and 203 discussed with reference to FIGS. 1 to 5. When the semiconductor substrate 210 is provided in a wafer level, a plurality of semiconductor chips may be formed on the semiconductor substrate 210. In this case, the semiconductor substrate 210 may undergo a singulation process to separate the semiconductor chips from each other. Alternatively, after the semiconductor chips 201, 202a, 202b, and 203 are bonded to form chip stacks CS in a subsequent process, a singulation process may be performed to separate the chip stacks CS from each other. After the formation of the semiconductor chip, the second carrier substrate 1020 may be removed.

The semiconductor substrate 210 and the first pads 260 formed on the semiconductor substrate 210 may become uneven when a thinning process is performed on the semiconductor substrate 210. According to some embodiments of the present inventive concept, after the thinning process, a planarization process as discussed above may be performed on the first passivation layer 270 and the first pads 260. Therefore, the passivation layer 270 and the first pads 260 may have flat (e.g., planar) surfaces, and when fabricated semiconductor chips are bonded to each other there may be a reduction in the occurrence of contact failure due to spacing between the semiconductor chips.

Referring to FIGS. 1 and 2, an intermediate semiconductor chip 202a may be disposed on a lower semiconductor chip 201. The semiconductor substrate 210 of the lower semiconductor chip 201 may have a front surface that is directed toward a rear surface of the semiconductor substrate 210 of the intermediate semiconductor chip 202a. Therefore, the second pads 240 of the lower semiconductor chip 201 may be vertically aligned with the first pads 260 of the intermediate semiconductor chip 202a. The top surface of the second passivation layer 250 of the lower semiconductor chip 201 may be in contact with the bottom surface of the first passivation layer 270 of the intermediate semiconductor chip 202a, and the top surfaces of the second pads 240 of the lower semiconductor chip 201 may be in contact with the bottom surfaces of the first pads 260 of the intermediate semiconductor chip 202a.

An annealing process may be performed on the lower semiconductor chip 201 and the intermediate semiconductor chip 202a. The annealing process may bond the second pads 240 of the lower semiconductor chip 201 to the first pads 260 of the intermediate semiconductor chip 202a. For example, the second pad 240 of the lower semiconductor chip 201 and the first pad 260 of the intermediate semiconductor chip 202a may be bonded to constitute a single unitary piece. The second pads 240 and the first pads 260 may be automatically bonded to each other. For example, the second pad 240 and the first pad 260 may be formed of the same material (e.g., copper (Cu)), and may be bonded to each other by an intermetallic hybrid bonding process resulting from surface activation at an interface between the second pad 240 and the first pad 260 that are in contact with each other. The annealing process may bond the second passivation layer 250 and the first passivation layer 270 to each other.

Through the procedure mentioned above, the intermediate semiconductor chip 202a may be bonded to the lower semiconductor chip 201. Another intermediate semiconductor chip 202b may be bonded to the intermediate semiconductor chip 202a, and an upper semiconductor chip 203 may be bonded to the intermediate semiconductor chip 202b. A bonding process of each of the intermediate semiconductor chip 202b and the upper semiconductor chip 203 may be substantially the same as the aforementioned bonding process of the intermediate semiconductor chip 202a. The processes mentioned above may fabricate a chip stack CS in which the semiconductor chips 201, 202a, 202b, and 203 are stacked.

The chip stack CS may be mounted on a first semiconductor chip 100. For example, a hybrid bonding method may be employed to bond the lower semiconductor chip 201 to the first semiconductor chip 100. Alternatively, the lower semiconductor chip 201 may be mounted on the first semiconductor chip 100 through one or more connection terminals such as solder balls.

Afterwards, a molding layer 300 may be formed by coating a dielectric on the first semiconductor chip 100, covering the chip stack CS.

Figure 18A:
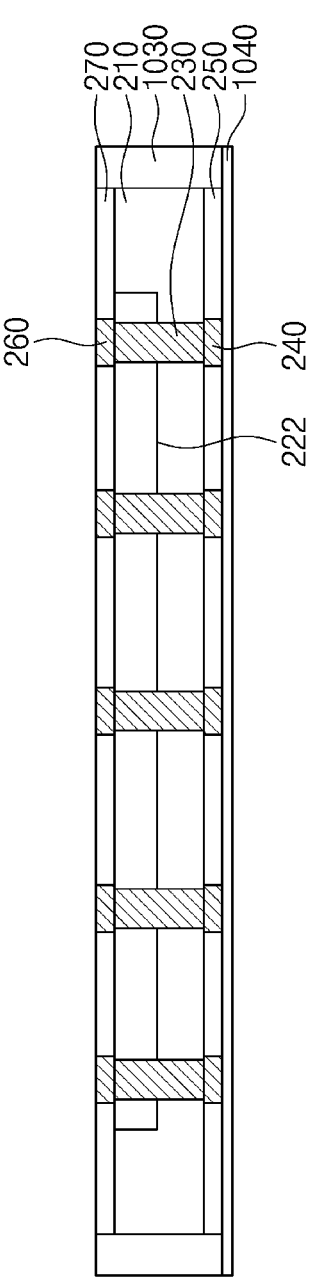
Figure 18B:
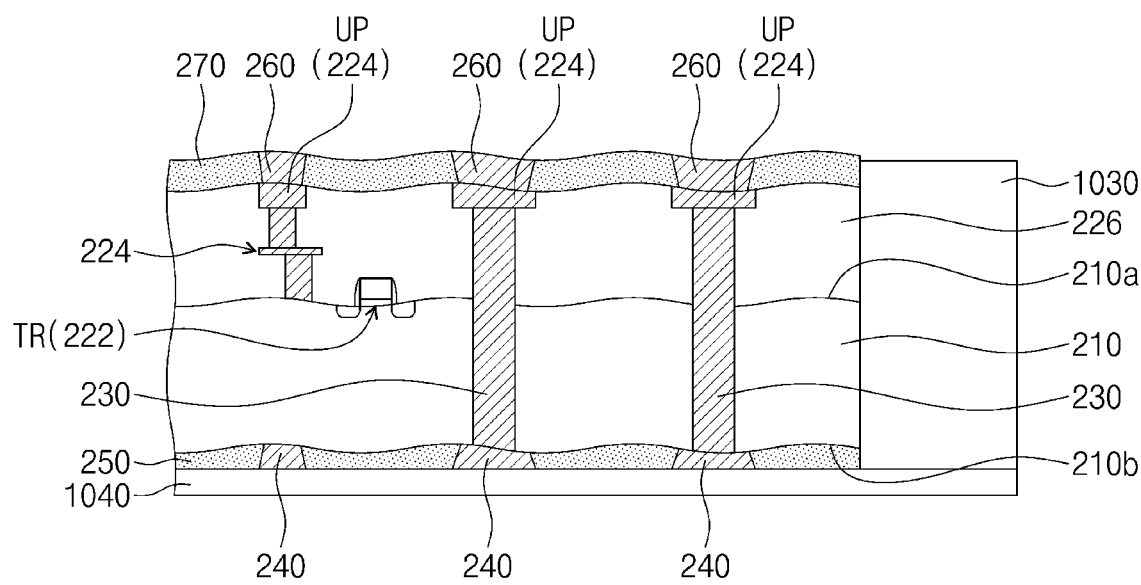
Figure 19A:
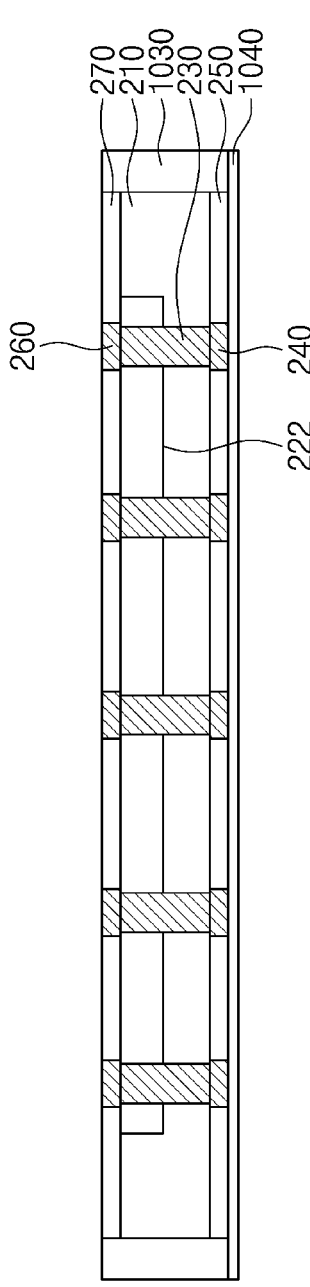
Figure 19B:
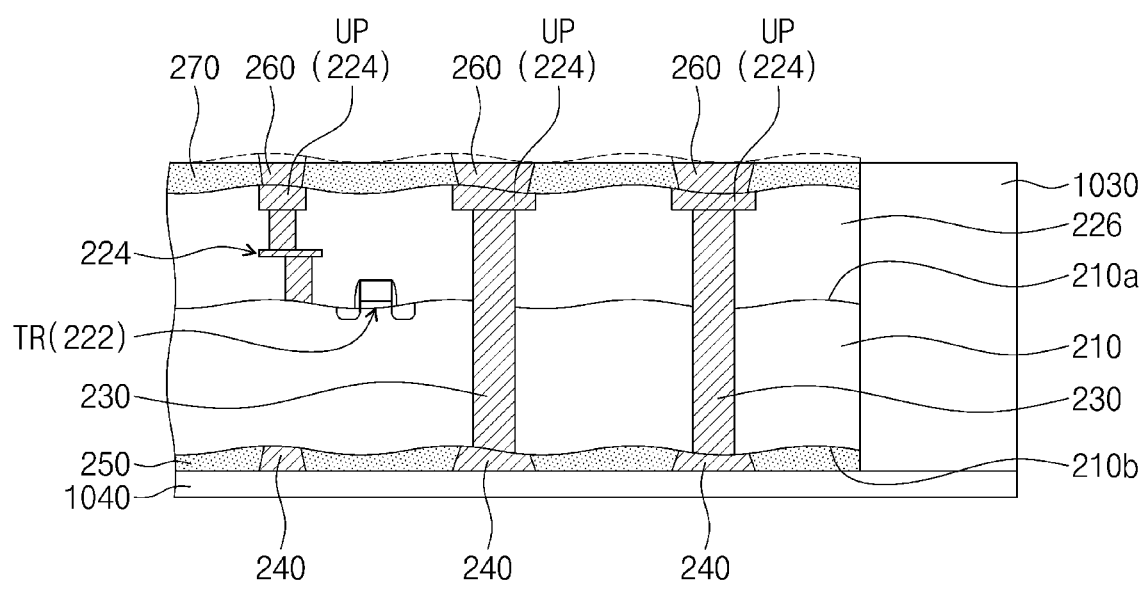

FIGS. 18A and 19A illustrate cross-sectional views showing a method of fabricating a semiconductor package according to some example embodiments of the present inventive concept. FIGS. 18B and 19B illustrate cross-sectional views showing a method of fabricating a semiconductor package according to some example embodiments of the present inventive concept.

Referring to FIGS. 18A and 18B, the second carrier substrate 1020 may be removed from a resultant structure of FIGS. 14A and 14B.

A ring frame 1030 and a glue tape 1040 may be provided. The ring frame 1030 may be configured to laterally fix the semiconductor substrate 210 and to facilitate holding and transferring of the semiconductor substrate 210. When viewed in a plan view, the ring frame 1030 may surround the semiconductor substrate 210. For example, the ring frame 1030 may surround the semiconductor substrate 210 along a lateral surface of the semiconductor substrate 210. The glue tape 1040 may be provided on a bottom surface of the ring frame 1030 and a bottom surface of the semiconductor substrate 210. The glue tape 1040 may be attached to the bottom surface of the ring frame 1030 and the bottom surface of the semiconductor substrate 210. The semiconductor substrate 210 may be fixed through the glue tape 1040 to the ring frame 1030. The ring frame 1030 may have a top surface located at a lower level than that of the top surfaces of the first pads 260 and that of the top surface of the first passivation layer 270.

Referring to FIGS. 19A and 19B, a third planarization process on the first passivation layer 270. After the third planarization process, the top surface of the first passivation layer 270 may be coplanar with those of the first pads 260. The third planarization process may cause the first passivation layer 270 and the first pads 260 to have substantially flat (e.g., planar) top surfaces. The third planarization process may continue until the first passivation layer 270 and the top surfaces of the first pads 260 have top surfaces located at the same level as that of the top surface of the ring frame 1030. In this sense, the top surface of the ring frame 1030 may be defined as a limit point of the third planarization process. Through the processes discussed above, a semiconductor chip may be formed.

According to some embodiments of the present inventive concept, the ring frame 1030 may be used to define an end point of the third planarization process, and thus it may be possible to easily control thicknesses of the first passivation layer 270 and the first pads 260. In addition, the first passivation layer 270 and the first pads 260 may have their surfaces located at the same level as that of the top surface of the ring frame 1030. The semiconductor substrate 210 may be movable together with the ring frame 1030 combined therewith, and it may be easy to accomplish contact and bonding between the semiconductor substrates 210 for the formation of the chip stack CS.

FIGS. 20A to 23A illustrate cross-sectional views showing a method of fabricating a semiconductor package according to some example embodiments of the present inventive concept. FIGS. 20B to 23B illustrate cross-sectional views showing a method of fabricating a semiconductor package according to some example embodiments of the present inventive concept.

Figure 20A:
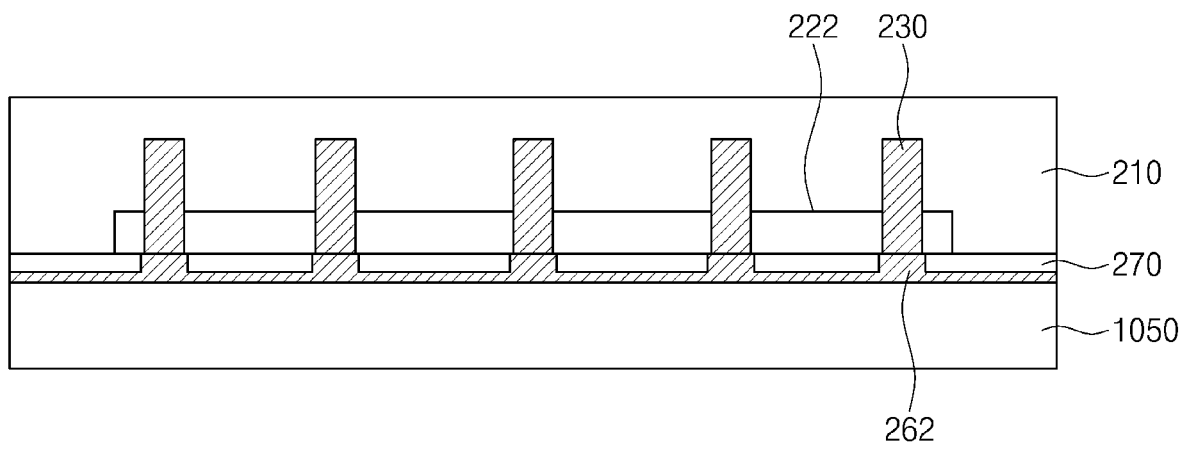
Figure 20B:
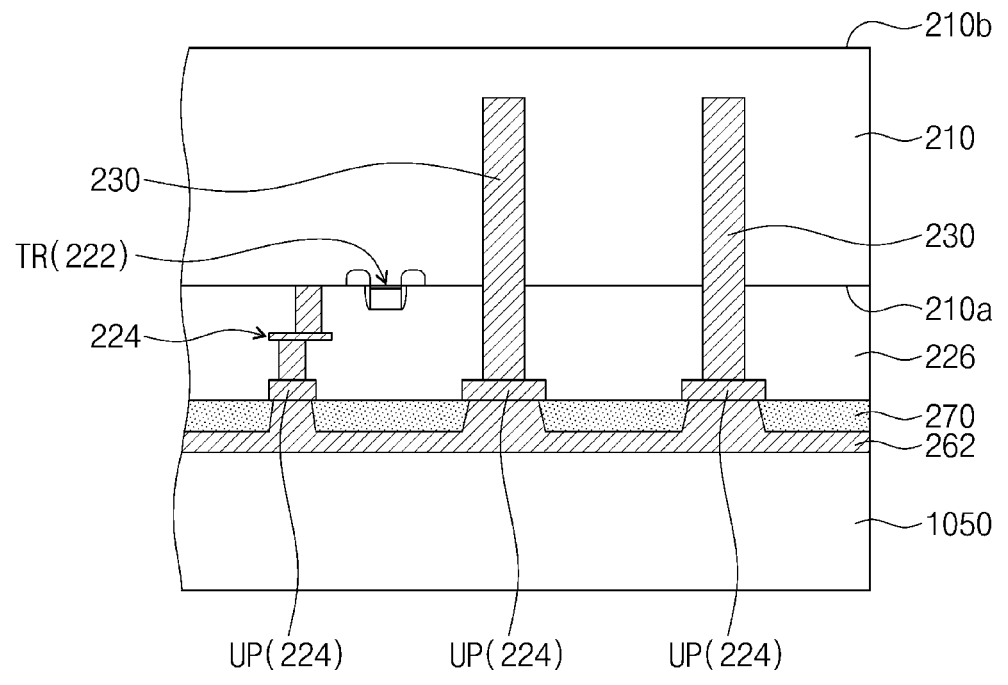

Referring to FIGS. 20A and 20B, on a resultant structure of FIGS. 9A and 9B, the semiconductor substrate 210 may be provided on a third carrier substrate 1050. The third carrier substrate 1050 may be a dielectric substrate including glass or polymer, or may be a conductive substrate including metal. An adhesive member may be provided on a top surface of the third carrier substrate 1050. For example, the adhesive member may include a glue tape. The semiconductor substrate 210 may be attached to the third carrier substrate 1050 to allow the conductive layer 262 to face toward the third carrier substrate 1050.

Figure 21A:
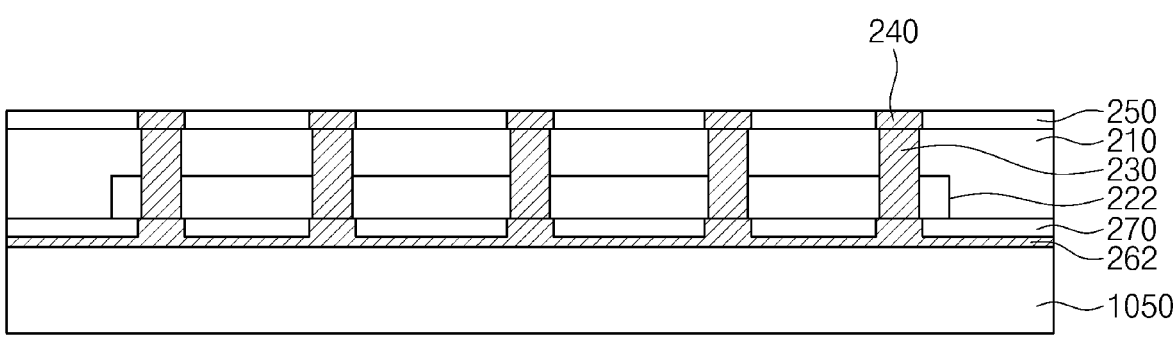
Figure 21B:
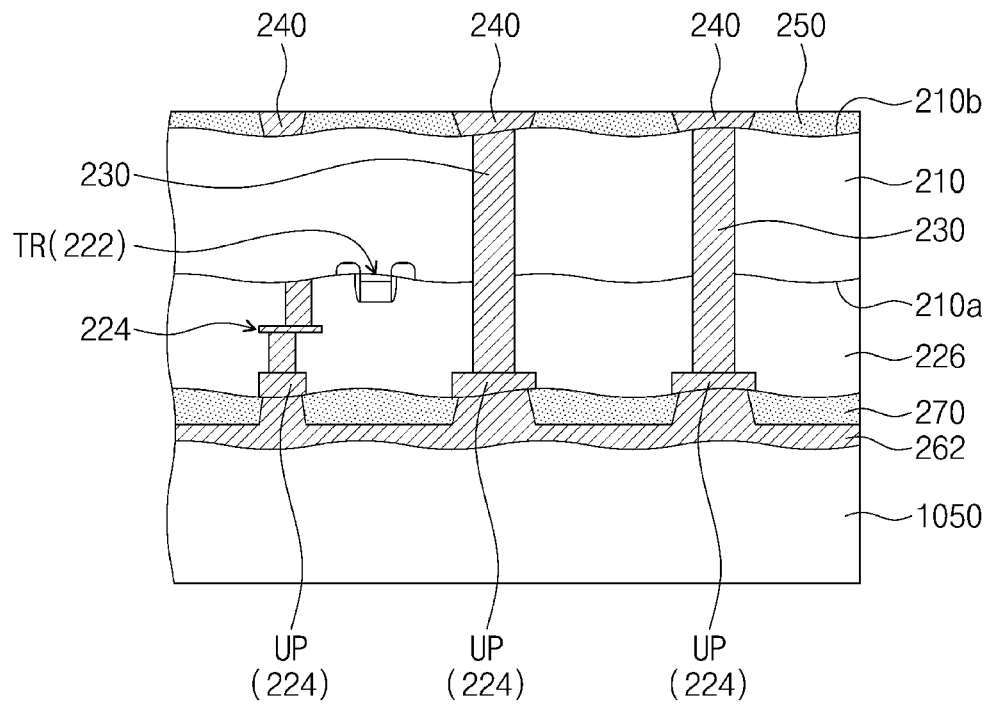

Referring to FIGS. 21A and 21B, a thinning process may be performed on the semiconductor substrate 210. The thinning process may be substantially the same as that discussed with reference to FIGS. 11A and 11B. After the thinning process, the top surfaces of the vias 230 may be exposed. The thinning process may induce deformation of the semiconductor substrate 210. For example, the semiconductor substrate 210 may be uneven. In addition, the thinning process may also induce deformation of the device interlayer dielectric layer 226, the first passivation layer 270, and the conductive layer 262. For example, after the thinning process, the device interlayer dielectric layer 226 may have a wavy shape on the bottom surface thereof, and the first passivation layer 270 and the conductive layer 262 may have wavy shapes on the bottom surfaces thereof.

After that, second pads 240 and the second passivation layer 250 may be formed on the semiconductor substrate 210. The formation of the second pads 240 and the second passivation layer 250 may be substantially the same as that discussed above with reference to FIGS. 12A, 12B, 13A, and 13B.

Figure 22A:
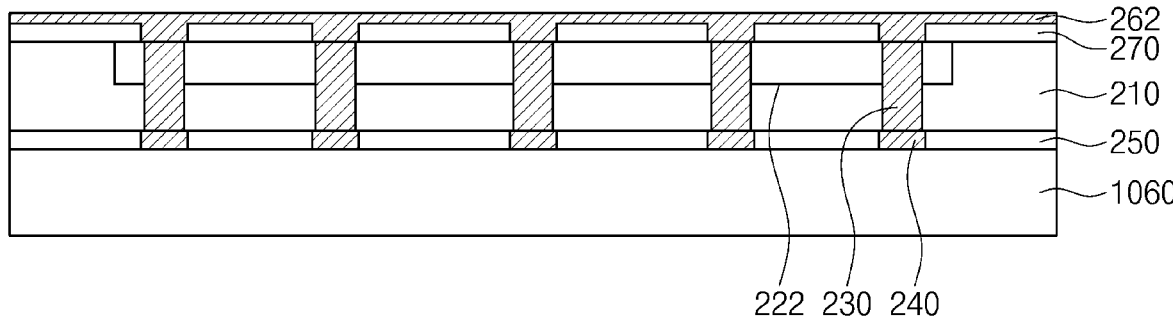
Figure 22B:
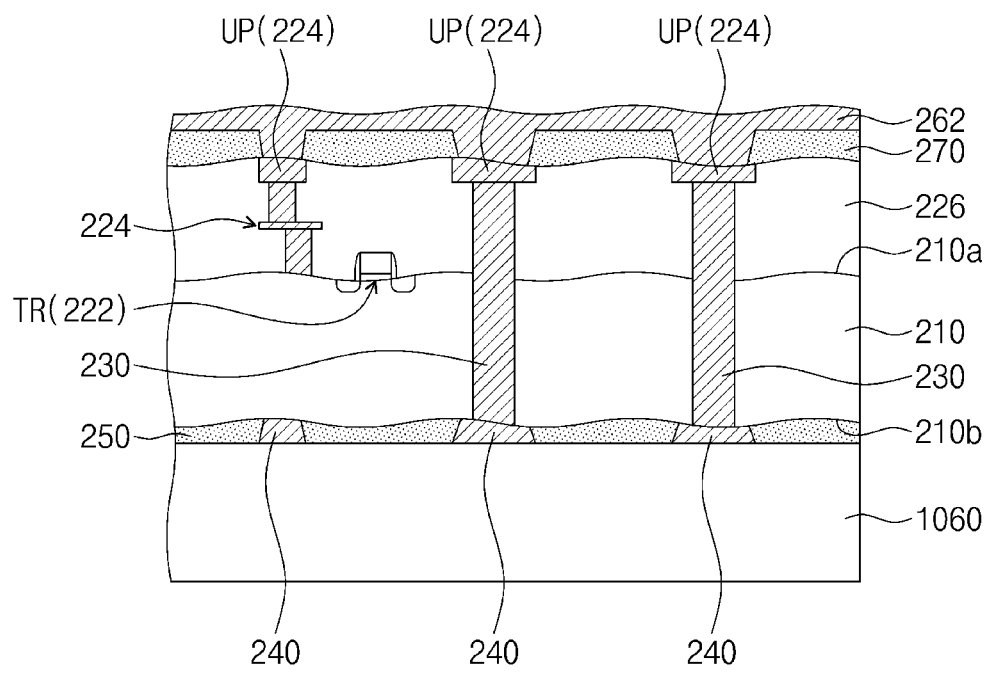

Referring to FIGS. 22A and 22B, the semiconductor substrate 210 may be provided on a fourth carrier substrate 1060. The fourth carrier substrate 1060 may be a dielectric substrate including glass or polymer, or may be a conductive substrate including metal. An adhesive member may be provided on a top surface of the fourth carrier substrate 1060. For example, the adhesive member may include a glue tape. The semiconductor substrate 210 may be attached to the fourth carrier substrate 1060 to allow the second passivation layer 250 and the second pads 240 to face toward the fourth carrier substrate 1060.

Thereafter, the third carrier substrate 1050 may be removed.

Figure 23A:
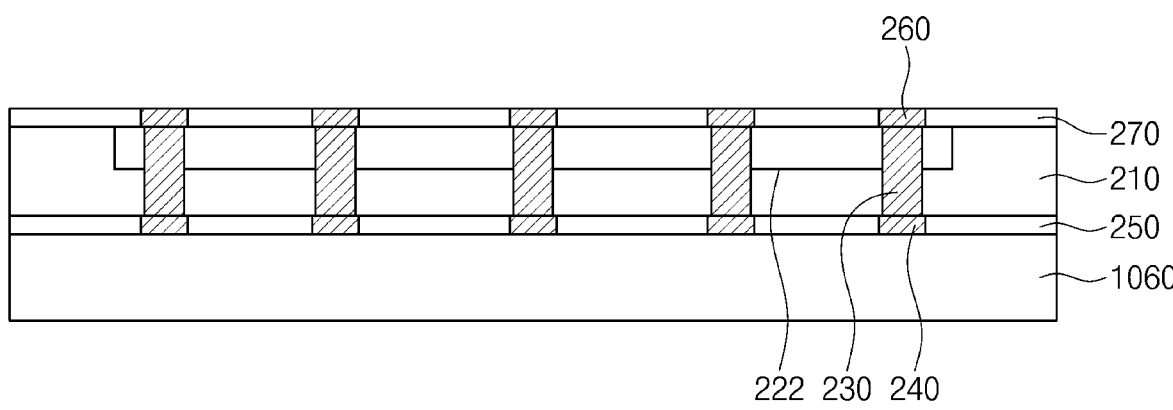
Figure 23B:
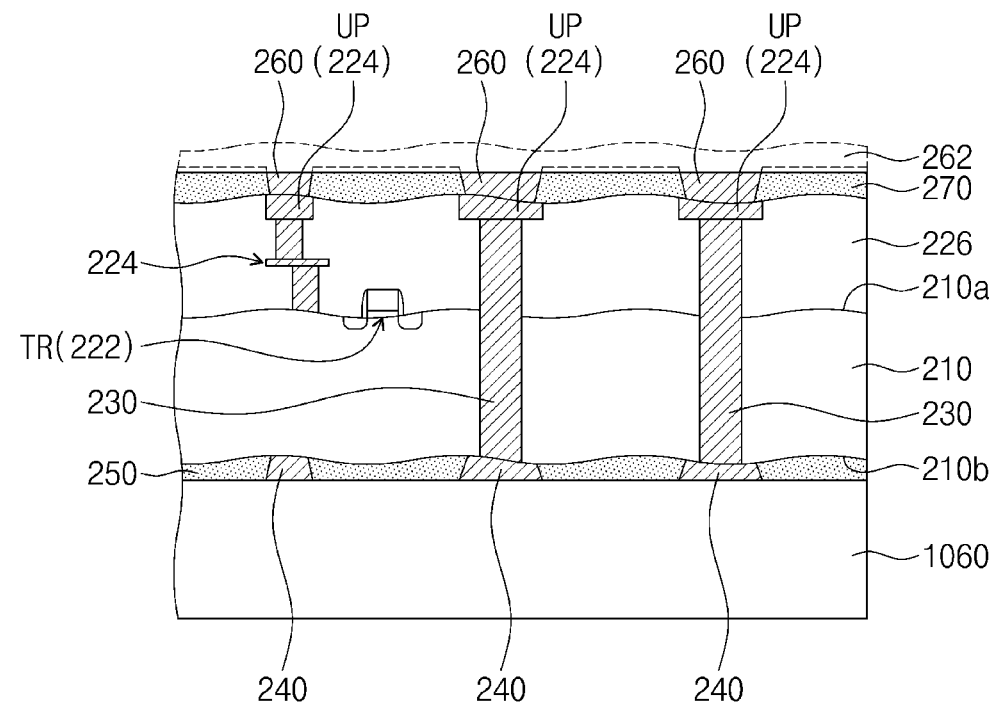

Referring to FIGS. 23A and 23B, a fourth planarization process may be performed on the conductive layer 262. For example, the fourth planarization process may include a chemical mechanical polishing (CMP) process. The fourth planarization process may continue until the top surface of the first passivation layer 270 is exposed. In the fourth planarization process, the conductive layer 262 may be separated to form first pads 260. After the fourth planarization process, the top surface of the first passivation layer 270 may be coplanar with those of the first pads 260. For example, the first passivation layer 270 and the first pads 260 may have substantially flat (e.g., planar) top surfaces. Through the processes discussed above, a semiconductor chip may be formed.

FIGS. 24A to 27A illustrate cross-sectional views showing a method of fabricating a semiconductor package according to some example embodiments of the present inventive concept. FIGS. 24B to 27B illustrate cross-sectional views showing a method of fabricating a semiconductor package according to some example embodiments of the present inventive concept.

Figure 24A:
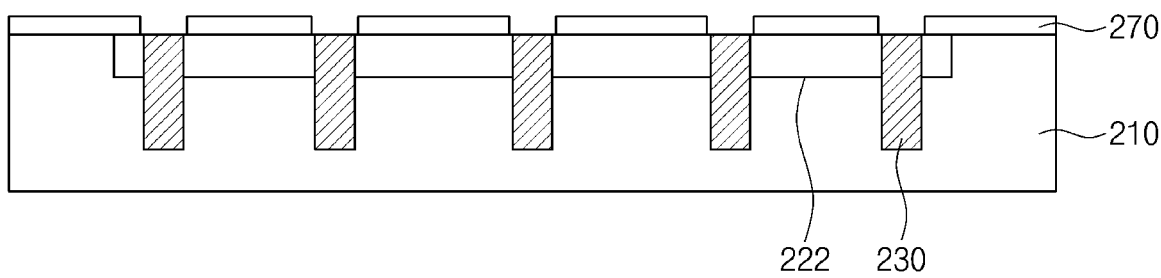
Figure 24B:
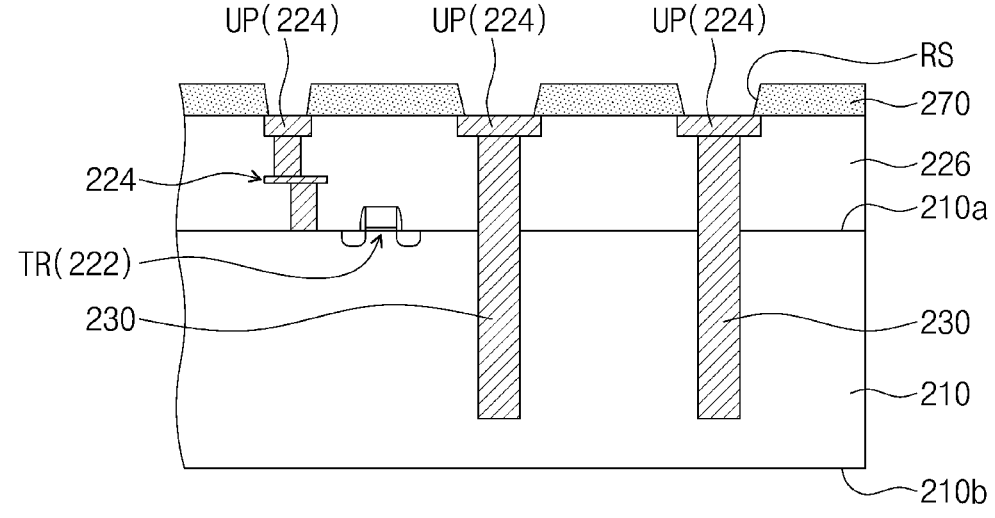

Referring to FIGS. 24A and 24B, on a resultant structure of FIGS. 8A and 8B, a first passivation layer 270 may be formed on the device interlayer dielectric layer 226. A dielectric layer may be formed to cover the device interlayer dielectric layer 226 and the under-pad pattern UP, and then the dielectric layer may be patterned to form the first passivation layer 270. The patterning process may cause the first passivation layer 270 to have recesses RS that are formed to expose the under-pad pattern UP.

Figure 25A:
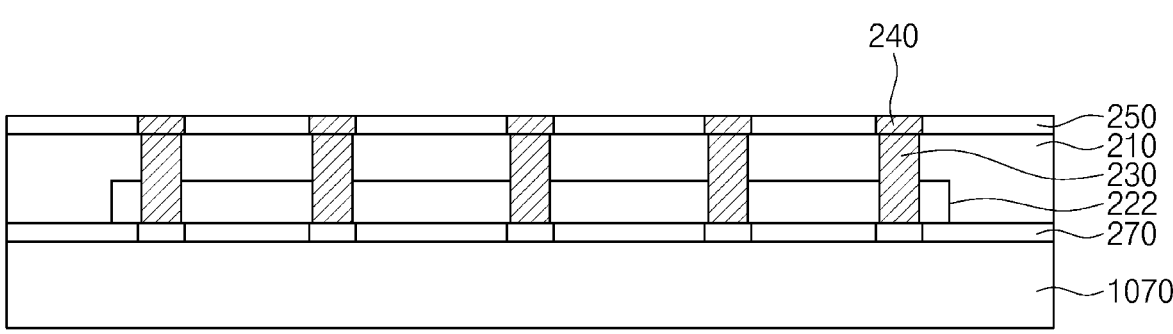
Figure 25B:
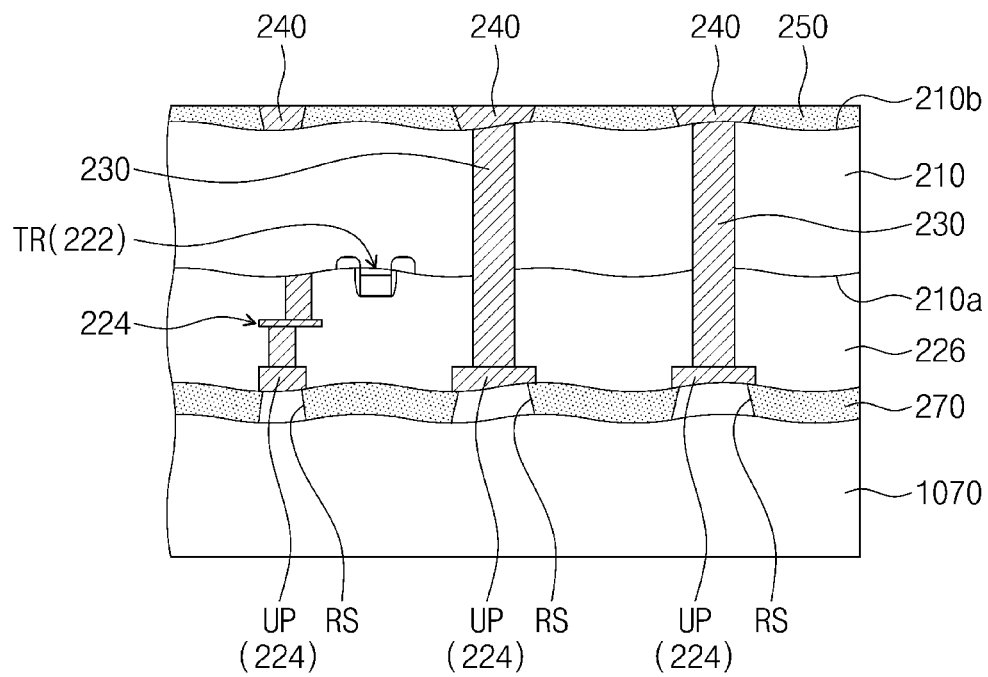

Referring to FIGS. 25A and 25B, the semiconductor substrate 210 may be provided on a fifth carrier substrate 1070. The fifth carrier substrate 1070 may be a dielectric substrate including glass or polymer, or may be a conductive substrate including metal. An adhesive member may be provided on a top surface of the fifth carrier substrate 1070. For example, the adhesive member may include a glue tape. The semiconductor substrate 210 may be attached to the fifth carrier substrate 1070 to allow the first passivation layer 270 to face toward the fifth carrier substrate 1070. The recesses RS may be covered with the fifth carrier substrate 1070.

A thinning process may be performed on the semiconductor substrate 210. The thinning process may be substantially the same as that discussed with reference to FIGS. 11A and 11B. After the thinning process, the top surfaces of the vias 230 may be exposed. The thinning process may induce deformation of the semiconductor substrate 210. For example, the semiconductor substrate 210 may be uneven. In addition, the thinning process may also induce deformation of the device interlayer dielectric layer 226 and the first passivation layer 270. For example, after the thinning process, the device interlayer dielectric layer 226 may have a wavy shape on the bottom surface thereof, and the first passivation layer 270 may have a wavy shape on the bottom surface thereof.

Afterwards, second pads 240 and the second passivation layer 250 may be formed on the semiconductor substrate 210. The formation of the second pads 240 and the second passivation layer 250 may be substantially the same as that discussed above with reference to FIGS. 12A, 12B, 13A, and 13B.

Figure 26A:
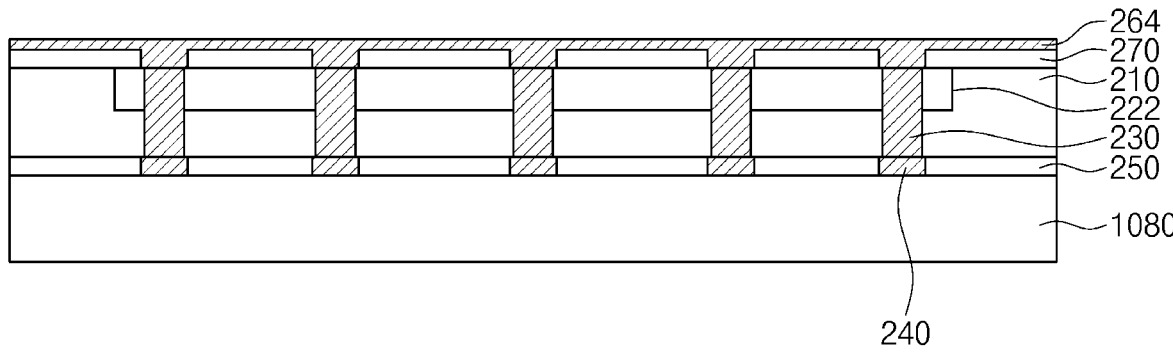
Figure 26B:
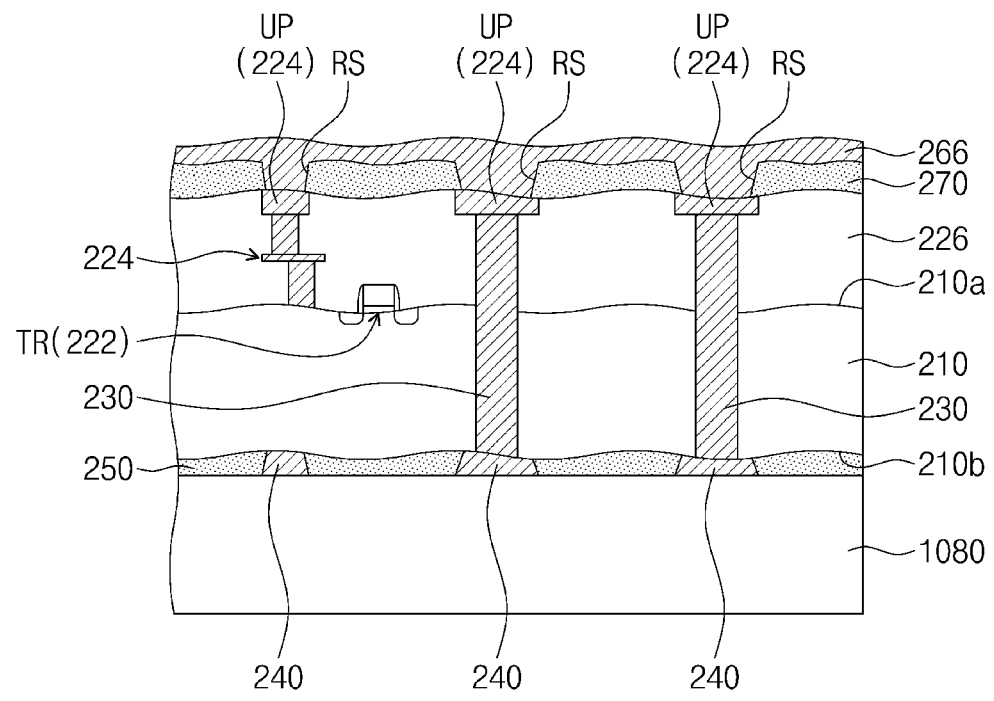

Referring to FIGS. 26A and 26B, the semiconductor substrate 210 may be provided on a sixth carrier substrate 1080. The sixth carrier substrate 1080 may be a dielectric substrate including glass or polymer, or may be a conductive substrate including metal. An adhesive member may be provided on a top surface of the sixth carrier substrate 1080. For example, the adhesive member may include a glue tape. The semiconductor substrate 210 may be attached to the sixth carrier substrate 1080 to allow the second passivation layer 250 and the second pads 240 to face toward the sixth carrier substrate 1080.

Thereafter, the fifth carrier substrate 1070 may be removed.

A conductive layer 266 may be formed on the first passivation layer 270. The conductive layer 266 may cover the first passivation layer 270 and fill the recesses RS. For example, a seed layer may be formed on the first passivation layer 270 to conformally cover a top surface of the first passivation layer 270 and inner sides of the recesses RS, and then the seed layer may be used as a seed to perform a plating process to form the conductive layer 266. The conductive layer 266 may include a conductive material, such as copper (Cu).

Figure 27A:
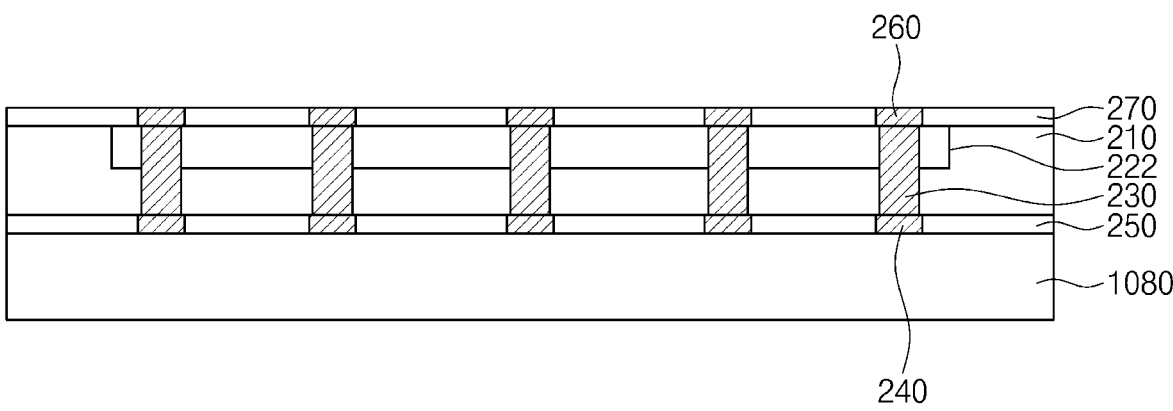
Figure 27B:
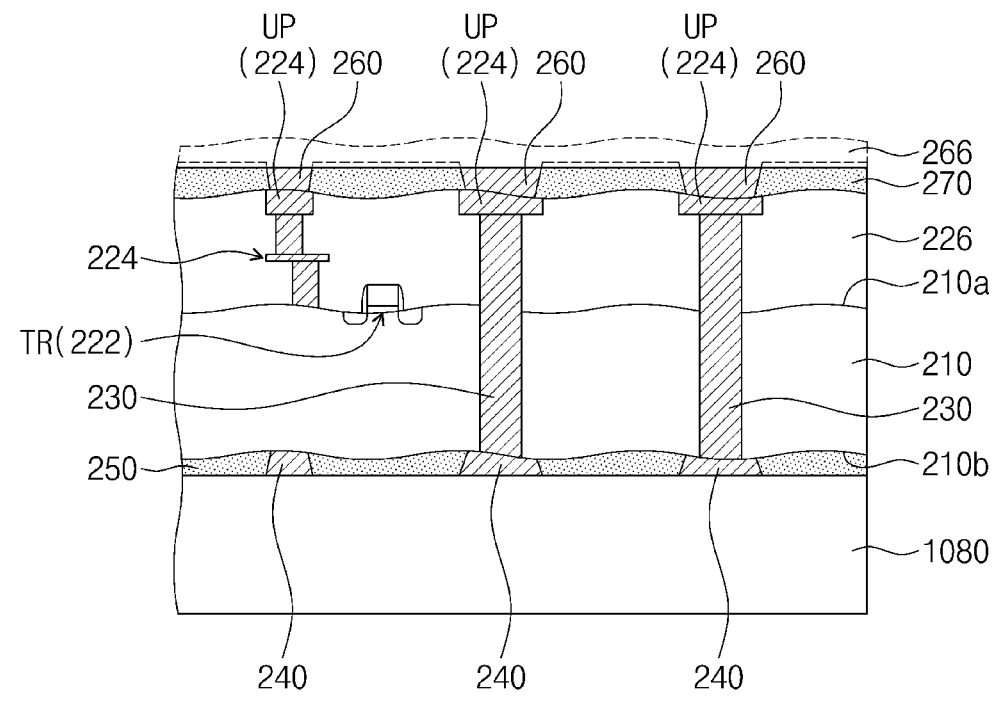

Referring to FIGS. 27A and 27B, a fifth planarization process may be performed on the conductive layer 266. For example, the fifth planarization process may include a chemical mechanical polishing (CMP) process. The fifth planarization process may continue until the top surface of the first passivation layer 270 is exposed. In the fifth planarization process, the conductive layer 266 may be separated to form first pads 260. After the fifth planarization process, the top surface of the first passivation layer 270 may be coplanar with those of the first pads 260. The first passivation layer 270 and the first pads 260 may have substantially flat (e.g., planar) top surfaces. Through the processes discussed above, a semiconductor chip may be formed.

FIGS. 28A to 30A illustrate cross-sectional views showing a method of fabricating a semiconductor package according to some example embodiments of the present inventive concept. FIGS. 28B to 30B illustrate cross-sectional views showing a method of fabricating a semiconductor package according to some example embodiments of the present inventive concept.

Figure 28A:
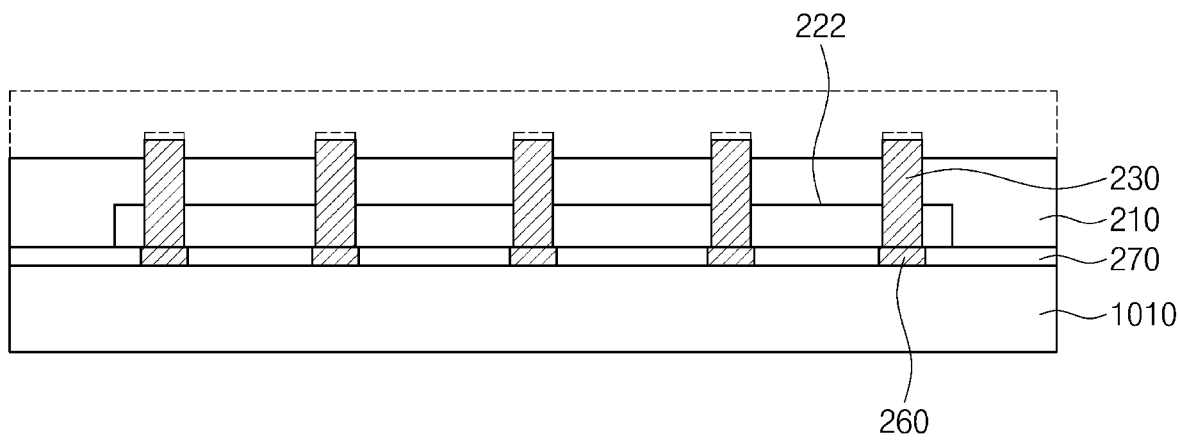
Figure 28B:
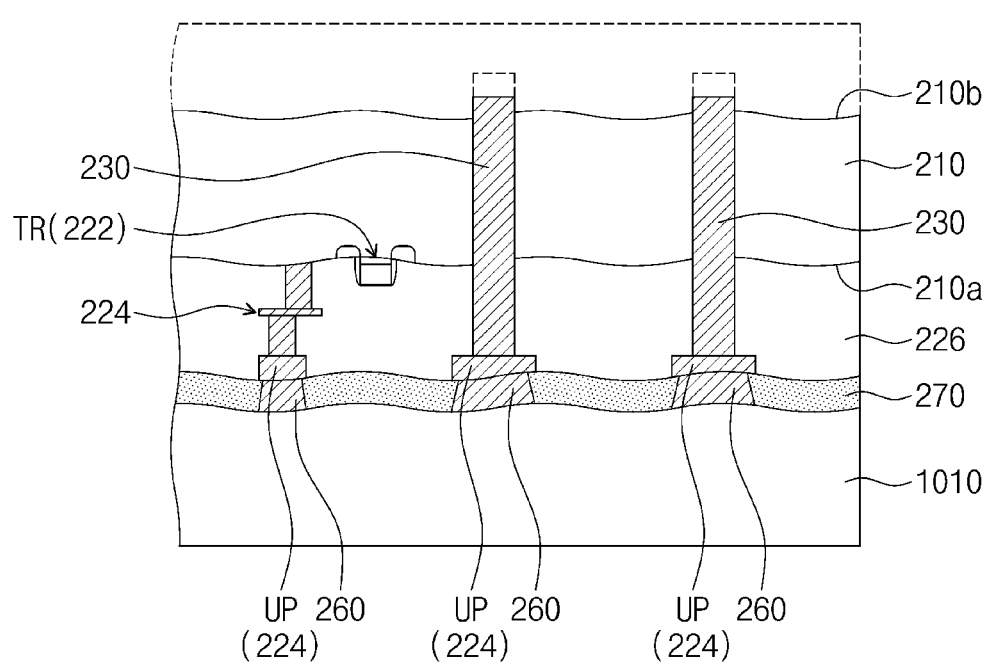

Referring to FIGS. 28A and 28B, a thinning process may be continuously performed on a resultant structure of FIGS. 11A and 11B. An etchant used for the thinning process may have a large difference in etch rate between the semiconductor substrate 210 and the vias 230. For example, when the thinning process is performed, the semiconductor substrate 210 may be etched more than the vias 230. Therefore, after the thinning process, the vias 230 may protrude from the rear surface 210b of the semiconductor substrate 210.

Figure 29A:
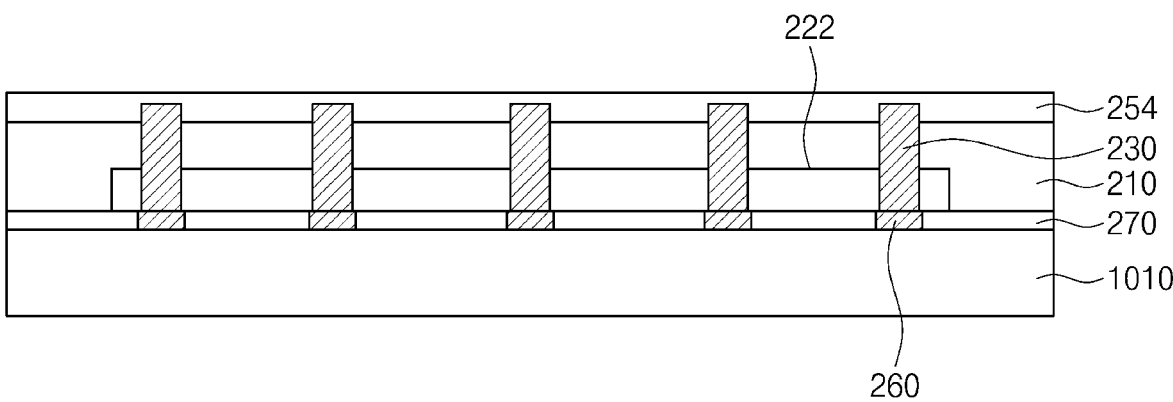
Figure 29B:
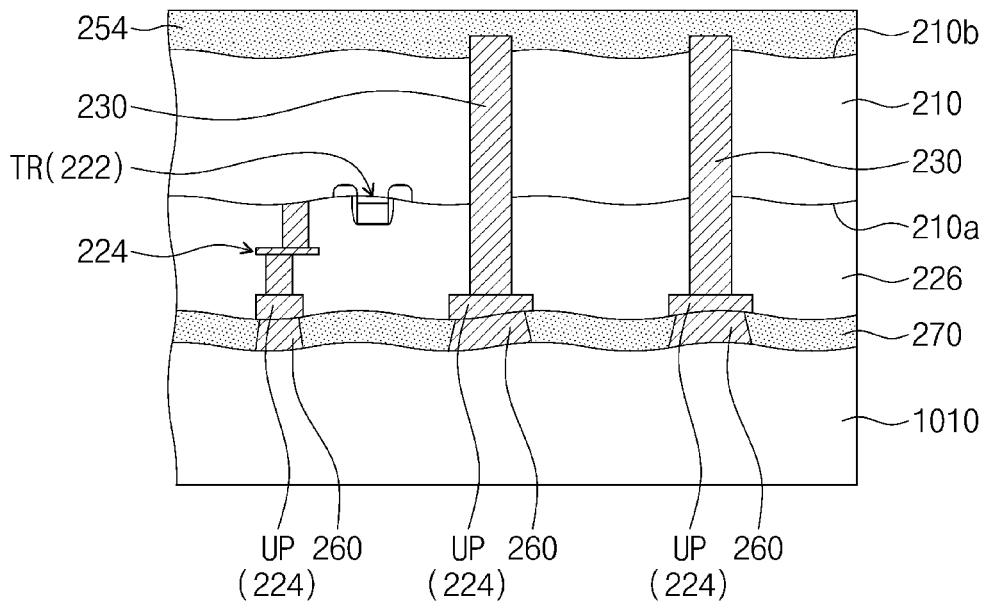

Referring to FIGS. 29A and 29B, a dielectric layer 254 may be formed on the semiconductor substrate 210. For example, a dielectric material may be deposited or coated on the rear surface 210b of the semiconductor substrate 210, thereby forming the dielectric layer 254. On the rear surface 210b of the semiconductor substrate 210, the dielectric layer 254 may cover the vias 230.

Figure 30A:
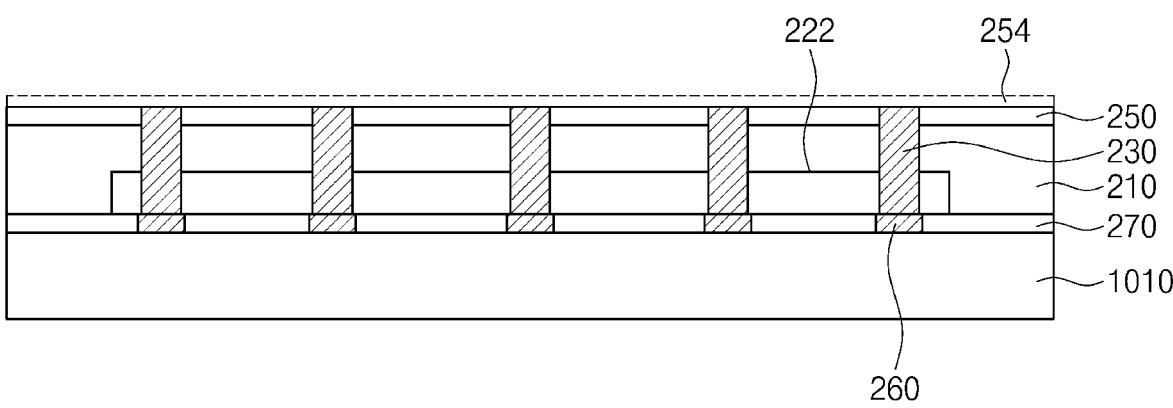
Figure 30B:
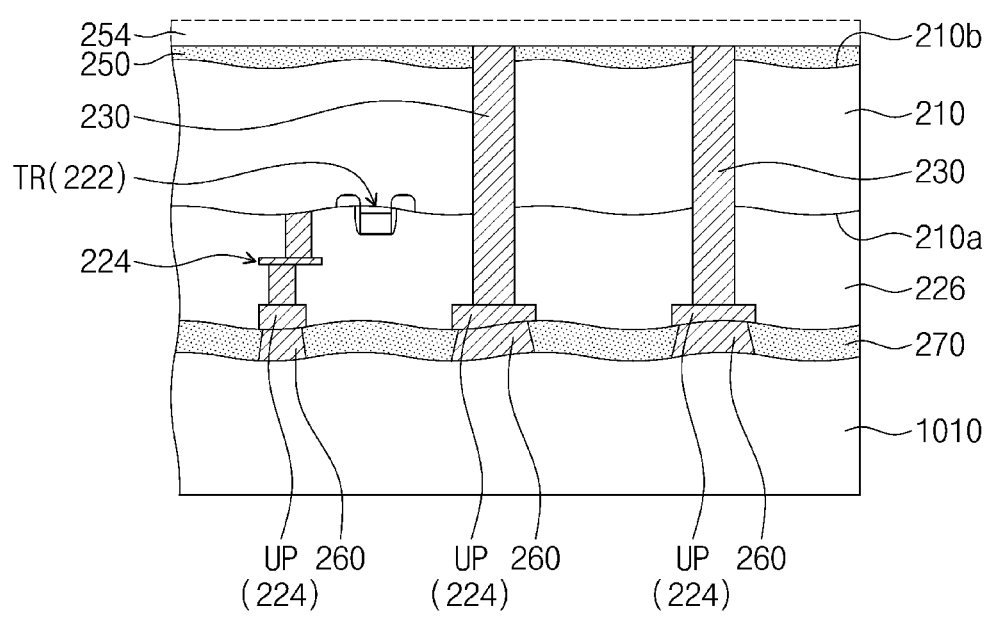

Referring to FIGS. 30A and 30B, a sixth planarization process may be performed on the dielectric layer 254. For example, the sixth planarization process may include a chemical mechanical polishing (CMP) process. The sixth planarization process may continue until the vias 230 are exposed. The sixth planarization process may remove an upper portion of the dielectric layer 254, thereby forming a second passivation layer 250. After the sixth planarization process, the second passivation layer 250 may have a top surface coplanar with those of the vias 230. The second passivation layer 250 and the vias 230 may have substantially flat (e.g., planar) top surfaces. The vias 230 and the second passivation layer 250 may correspond to the second vias 230 and the second upper passivation layer 250 that are discussed with reference to FIGS. 4 and 5.

Afterwards, the processes may be performed which are discussed with reference to FIGS. 14A to 17A and 14B to 17B.

In a semiconductor package according to some embodiments of the present inventive concept, even though semiconductor chips have crooked semiconductor substrates, an upper passivation layer and a lower passivation layer may have flat (e.g., planar) shapes. A flat (e.g., planar) contact surface may be provided between the upper passivation layer and the lower passivation layer of the semiconductor chips, and no spacing may be present between the upper passivation layer and the lower passivation layer. Therefore, good contact may be provided between the upper passivation layer and the lower passivation layer, or between the semiconductor chips, and a semiconductor package may improve in structural stability. In addition, no spacing may be present between upper pads and lower pads of the semiconductor chips. Therefore, good contact may be provided between the upper pads and the lower pads, and the semiconductor package may have good electrical connection between the semiconductor chips.

In a semiconductor package according to some embodiments of the present inventive concept, a semiconductor substrate, a passivation, and pads may become uneven when a thinning process is performed on the semiconductor substrate, and after the thinning process, a planarization process may be performed on the passivation layer and the pads. Therefore, the passivation layer and the pads may have flat (e.g., planar) surfaces, and when fabricated semiconductor chips are bonded to each other there may be a reduction in the occurrence of contact failure due to spacing between semiconductor chips.

Although aspects of the present inventive concept have been described in connection with the some embodiments of the present inventive concept illustrated in the accompanying drawings, it will be understood by one of ordinary skill in the art that variations in form and detail may be made therein without departing from the spirit and essential feature of the embodiments of the present inventive concept. The above disclosed embodiments should thus be considered illustrative and not restrictive.

What is claimed is:

1. A method of fabricating a semiconductor package, the method comprising:

providing a semiconductor substrate extending in a first direction and a second direction, perpendicular to the first direction, the semiconductor substrate having an active surface and an inactive surface that is opposite to the active surface;

forming a transistor on the active surface of the semiconductor substrate;

forming through vias in the semiconductor substrate, the through vias extending from the active surface into the semiconductor substrate, the through vias each including a first end that faces the inactive surface and is covered by a corresponding portion of the semiconductor substrate;

then, forming a first pad layer on the active surface of the semiconductor substrate;

then, performing a first planarization process comprising planarizing the first pad layer including removing material from the first pad layer;

then, thinning the semiconductor substrate by performing on the inactive surface of the semiconductor substrate a thinning process including removing semiconductor material from the inactive surface to uncover and expose the first ends of each of the through vias;

then, forming a second pad layer on the inactive surface of the semiconductor substrate;

then, performing a second planarization process comprising planarizing the second pad layer including removing material from the second pad layer; and after the second planarization process, performing a third planarization process comprising planarizing the first pad layer including removing material from the first pad layer.

2. The method of claim 1, wherein the first pad layer includes:

first pads; and a first passivation layer that surrounds the first pads and exposes one surface of each of the first pads, wherein, after the third planarization process, a first surface of the first passivation layer is flat, the first surface being opposite to the semiconductor substrate.

3. The method of claim 2, wherein a second surface of the first passivation layer is uneven, the second surface facing the semiconductor substrate.

4. The method of claim 2, wherein, after the third planarization process, a thickness, in a third direction perpendicular to the first direction and the second direction, of the first passivation layer is changed based on position along the first direction.

5. The method of claim 4, wherein a deviation between maximum and minimum values of the thickness of the first passivation layer is in a range of about 50 Å to about 500 Å.

6. The method of claim 2, wherein the second pad layer includes:

second pads; and a second passivation layer that surrounds the first pads and exposes one surface of each of the first pads, wherein, after the second planarization process, a third surface of the second passivation layer is flat, the third surface being opposite to the semiconductor substrate.

7. The method of claim 2, further comprising, before performing the third planarization process, forming an additional conductive layer on the first pad layer, wherein the additional conductive layer is connected to first pads on the first pad layer, and wherein the additional conductive layer and the first pads are formed of the same material.

8. The method of claim 7, further comprising, before performing the third planarization process, forming an additional dielectric layer on the first pad layer, wherein the additional dielectric layer is connected to a first passivation layer of the first pad layer, and wherein the additional dielectric layer and the first passivation layer of the first pad layer are formed of the same material.

9. The method of claim 1, wherein the thinning process causes the semiconductor substrate and the first pad layer to have a wavy shape.

10. The method of claim 1, wherein performing the third planarization process includes:

fixing the semiconductor substrate inside a ring frame that surrounds the semiconductor substrate; and performing a chemical mechanical polishing (CMP) process on the semiconductor substrate and the ring frame, or wherein performing the third planarization process includes:

attaching the semiconductor substrate to a carrier substrate;

performing a chemical mechanical polishing (CMP) process on the semiconductor substrate; and removing the carrier substrate.

11. The method of claim 1, wherein forming the first pad layer includes:

before the thinning process, forming on the semiconductor substrate a first passivation layer that has openings; and forming on the first passivation layer a conductive layer that fills the openings; and performing a separation process to separate the conductive layer into discrete first pads in the openings.

12. The method of claim 11, wherein the conductive layer is formed before performing the thinning process, and the separation process of the conductive layer is performed by using the first planarization process or the third planarization process.

13. The method of claim 11, wherein the conductive layer is formed after the thinning process is performed, and the separation process of the conductive layer is performed by using the third planarization process.

14. A method of fabricating a semiconductor package, the method comprising:

providing a semiconductor substrate extending in a first direction and a second direction, perpendicular to the first direction;

forming a semiconductor element on an active surface of the semiconductor substrate;

forming first pads on the active surface of the semiconductor substrate and a first passivation layer that surrounds the first pads and exposes one surface of each of the first pads;

performing a first planarization process comprising planarizing the first pads and planarizing the first passivation layer including removing material from the first pads and the first passivation layer;

performing a thinning process to the semiconductor substrate comprising thinning by removing material from an inactive surface of the semiconductor substrate;

performing a second planarization process comprising planarizing the inactive surface of the semiconductor substrate including removing material from the semiconductor substrate; and performing a third planarization process comprising planarizing the first pads and the first passivation layer including material from the first pads and first passivation layer, wherein, after the third planarization process, a thickness, in a third direction perpendicular to the first direction and the second direction, of the first passivation layer is changed based on position along the first direction.

15. The method of claim 14, wherein, after the third planarization process, a first surface of the first passivation layer is flat, the first surface being opposite to the semiconductor substrate.

16. The method of claim 15, wherein a second surface of the first passivation layer is uneven, the second surface facing the semiconductor substrate.

17. The method of claim 14, wherein a deviation between maximum and minimum values of the thickness of the first passivation layer is in a range of about 50 Å to about 500 Å.

18. The method of claim 14, further comprising, before the second planarization process, forming second pads on the inactive surface of the semiconductor substrate and a second passivation layer that surrounds the second pads and exposes one surface of each of the second pads, wherein the second planarization process is performed on the second pads and the second passivation layer, and wherein, after the second planarization process, a third surface of the second passivation layer is flat, the third surface being opposite to the semiconductor substrate.

19. The method of claim 14, wherein the thinning process causes the semiconductor substrate to have a wavy shape.

20. The method of claim 14, further comprising, before performing the third planarization process, forming an additional conductive layer or an additional dielectric layer on the first pads and the first passivation layer, wherein the third planarization process exposes the first pads and the first passivation layer.

* * * * *